(12) United States Patent
Yoshida et al.

(10) Patent No.: US 6,614,822 B2
(45) Date of Patent: Sep. 2, 2003

(54) SEMICONDUCTOR LASER DEVICES, AND SEMICONDUCTOR LASER MODULES AND OPTICAL COMMUNICATION SYSTEMS USING THE SAME

(75) Inventors: Junji Yoshida, Tokyo (JP); Naoki Tsukiji, Tokyo (JP); Takeshi Aikiyo, Tokyo (JP); Satoshi Koyanagi, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 67 days.

(21) Appl. No.: 09/776,226

(22) Filed: Feb. 2, 2001

(65) Prior Publication Data

US 2001/0048702 A1 Dec. 6, 2001

Related U.S. Application Data

(63) Continuation-in-part of application No. 09/680,153, filed on Oct. 3, 2000, which is a continuation of application No. PCT/JP00/00590, filed on Feb. 3, 2000.

(30) Foreign Application Priority Data

| Feb. 3, 2000 | (JP) | ............................................ 12-026130 |
| Aug. 3, 2000 | (JP) | ............................................ 12-236284 |
| Aug. 3, 2000 | (JP) | ............................................ 12-286283 |

(51) Int. Cl.$^7$ .............................. H01S 5/00; H01S 3/08
(52) U.S. Cl. .............................. 372/45; 372/49; 372/99
(58) Field of Search ................................. 372/6, 46, 99, 372/49, 102, 92, 75, 45; 359/333, 331.1

(56) References Cited

U.S. PATENT DOCUMENTS

| 4,616,898 A | 10/1986 | Hicks, Jr. ..................... 385/24 |
| 5,189,679 A | 2/1993 | Derry et al. .................. 372/45 |
| 5,305,336 A | 4/1994 | Adar et al. .................... 372/18 |
| 5,563,732 A | 10/1996 | Erdogan et al. ........ 359/341.31 |

(List continued on next page.)

FOREIGN PATENT DOCUMENTS

| EP | 800243 A2 | 10/1997 | ........... H01S/3/025 |
| EP | 081240 A | 12/1997 | ........... H01S/3/085 |
| JP | 62-276892 A | 12/1987 | ............. H01S/3/18 |
| JP | 03-049281 A | 3/1991 | ............. H01S/3/18 |

(List continued on next page.)

OTHER PUBLICATIONS

G.P. Agrawal, "Longitudinal–Mode Stabilization in Semiconductor Lasers with Wavelength–Selective Feedback," Journal of Applied Physics, vol. 59, No. 12, Jun. 15, 1986, pp. 3958–3961.

S. Oshiba, et al., "High–Power Output Over 200mW of 1.3 $\mu$m GaInAsP VIPS Lasers," IEEE Journal of Quantum Electronics, vol. QE–23, No. 6, Jun. 1987, pp. 738–743.

(List continued on next page.)

*Primary Examiner*—Quyen Leung
(74) *Attorney, Agent, or Firm*—Sheppard Mullin Richter & Hampton LLP

(57) ABSTRACT

A semiconductor laser device and module for use in a dense wavelength division multiplexed optical communications system are shown. The laser device preferably has cavity lengths greater than 1000 $\mu$m, and compressive strain multiquantum well active layer, and front-facet reflectivity of less than about 4%. Higher optical outputs and longer cavity lengths are achieved. Preferred modules use these laser diodes with external wavelength-selective reflectors that have narrow bandwidths of 3 nm or less, and which include a plurality of longitudinal mode subpeaks within the bandwidth. Relationships between reflectivity value of the front facet and the peak reflectivity of the wavelength-selective reflector for long cavity length laser device are also disclosed, with the relationships providing higher output power along with a stabilized output spectrum.

31 Claims, 10 Drawing Sheets

U.S. PATENT DOCUMENTS

| | | |
|---|---|---|
| 5,699,377 A | 12/1997 | Pan .............................. 372/92 |
| 5,721,636 A | 2/1998 | Erdogan et al. ........ 359/341.33 |
| 5,724,377 A | 3/1998 | Huang .......................... 372/22 |
| 5,737,474 A | 4/1998 | Aoki et al. .................. 385/131 |
| 5,801,403 A | 9/1998 | He .............................. 257/94 |
| 5,845,030 A | 12/1998 | Sasaki et al. .................. 385/88 |
| 5,936,763 A | 8/1999 | Mitsuda et al. ........ 359/341.33 |
| 5,960,019 A | 9/1999 | Hayashi et al. ............... 372/46 |
| 5,978,401 A | 11/1999 | Morgan ........................ 372/50 |
| 5,995,525 A | 11/1999 | Kosugi ......................... 372/36 |
| 5,995,692 A | 11/1999 | Hamakawa et al. .......... 385/49 |

FOREIGN PATENT DOCUMENTS

| | | | | |
|---|---|---|---|---|
| JP | 04-343492 A | 11/1992 | ............. | H01S/3/18 |
| JP | 05-136511 A | 6/1993 | .......... | H01S/3/131 |
| JP | 05-206579 A | 8/1993 | ............. | H01S/3/18 |
| JP | 05-206580 A | 8/1993 | ............. | H01S/3/18 |
| JP | 5-315705 A | 11/1993 | ............. | H01S/3/18 |
| JP | 05-327031 A | 12/1993 | .......... | H01S/35/28 |
| JP | 07-099373 A | 4/1995 | ............. | H01S/3/18 |
| JP | 07-333470 A | 12/1995 | ............ | G02B/6/42 |
| JP | 8-201609 A | 8/1996 | ............. | H01S/3/18 |
| JP | 08-330671 A | 12/1996 | ............. | H01S/3/18 |
| JP | 09-083059 A | 3/1997 | ............. | H01S/3/18 |
| JP | 09-083070 A | 3/1997 | ............. | H01S/3/18 |
| JP | 09-219475 A | 8/1997 | .......... | H01L/23/38 |
| JP | 09-260766 A | 10/1997 | ............. | H01L/3/18 |
| JP | 09-269439 A | 10/1997 | ............ | G02B/6/42 |
| JP | 09-275240 A | 10/1997 | ............. | H01S/3/18 |
| JP | 9-283847 A | 10/1997 | ............. | H01S/3/18 |
| JP | 09-298319 A | 11/1997 | .......... | H01L/35/30 |
| JP | 10-062654 A | 3/1998 | ............ | G02B/6/42 |
| JP | 10-154847 A | 6/1998 | ............. | H01S/3/18 |
| JP | 11-017248 A | 1/1999 | .......... | H01S/3/085 |

OTHER PUBLICATIONS

Toshio Nonaka, "Pumping Sources for Optical Fiber Amplifiers," Optronics, (published by The Optronics Co., Ltd.), No. 107, Nov. 1990, (In Japanese, English–Language Abstract on the last page).

Asano, et al., "1.48 μm High–Power InGaAs/InGaAsP MQW LD's for ER–Doped Fiber Amplifiers," IEEE Photonics Technology Letters, vol. 3, No. 5, May 1991, pp. 415–417.

Ikuo Mito and Kenji Endo, "1.48 μm and 0.98 μm High–Power Laser diodes for Erbium–Doped Fiber Amplifiers," *Optical amplifiers and their applications,* summaries of papers presented at the Optical Amplifiers and Their Applications Topical Meeting, Jul. 24–26, 1991, Snowmass Village, Colorado, cosponsored by IEEE/Lasers and Electro–optics Society and the Optical Society of America, Technical digest series. 1991, v. 13, pp. 22–25. (Jul. 1991).

T. Higashi, et al., "Optimum Asymmetric Mirror Facets Structure for High Efficiency Semiconductor Lasers," 13th IEEE International Semiconductor Laser Conference, Sep. 1992, Takamatsu Japan, pp. 46–47.

C. R. Giles, et al., "Simultaneou Wavelength–Stabilization of 980–nm Pump Lasers," *Optical amplifiers and their applications,* summaries of papers presented at the Optical Amplifiers and Their Applications Topical Meeting, Jul. 4–6, 1993, Yokohama, Japan, cosponsored by Optical Society of America and the IEEE Lasers and Electro–Optics Society, pp. 380–383.

A. Kasukawa, et al., "Extremely High Power 1.48 μm GaInAsP/InP GRIN–SCH Strained MQW Lasers," IEEE Photonics Technology Letters, vol. 6: No. 1, Jan. 194, pp. 4–6.

M. Shigehara, et al., "Single Longitudinal Mode Laser Diode using Fiber Bragg Grating," Proceedings of the 1995 of the IEICE General Conference (The Institute of Electronics, Information and Communications Engineers), Mar. 27, 1995, p. 380 (In Japanese, Partial English–language translation attached).

T. Wakami, et al., "0.98 μm Laser Diode with Fiber Bragg Gratings," Proceeding of the 1995 Electronics Society Conference of IEICE (The Institute of Electronics, Information and Communications Engineers), Sep. 5, 1995, p. 156 (In Japanese, Partial English–language translation attached).

R. J. Campbell, et al., "Wavelenghth Stable Uncooled Laser for Access Networks," Proceedings of the 21st European Conference on Optical Communications (ECOC'95), Sep. 17–21, 1995, pp. 545–548.

Don Hargreaves, et al., "High–power 980–nm Pump Module Operating Without a Thermoelectric Cooler," 1996 Technical Digest Series (Conference Edition) of the Optical Fiber Communication 1996 ("OFC '96"), Optical Society of America, Feb. 25, 1996 (San Jose California), pp. 229–230.

J. Piprek, et al., "Cavity Length Effects on Internal Loss and Quantum Efficiency of Multiquantum–Well Lasers," IEEE Journal of Selected Topics in Quantum Electronics, vol. 5, No. 3, May/Jun. 1999, pp. 643–647 (UCSB).

Akihiko Kasukawa, Tomokazu Mukaihara, Takeharu Yamaguchi, Jun'jiro Kikawa, "Recent Progress of High Power Semiconductor Laser for EDFA Pumping," Furukawa Review, No. 19, Apr. 2000, pp. 23–28.

Akihiro Kasukawa, Tomokazu Mukaihara, Takeharu Yamaguchi, Jun'jiro Kikawa, "Recent Developments in High–Power Semiconductor Lasers for Pumping of Optical Fiber Amplifiers," Furukawa Electric Review, No. 105, Jan. 2000, pp. 13–18. (In Japanese).

Toshio Kimura, Naoki Tsukiji, Junji Yoshida, Naoki Kimura, Takeshi Aikiyo, Tetsuro Ijichi, and Yoshikazu Ikegami, "1480–nm Laser Diode Module with 250–mW Output for Optical Amplifiers (Fol 1404QQ Series)," Furukawa Review, No. 19, Apr. 2000, pp. 29–33.

Toshio Kimura, Naoki Tsukiji, Junji Yoshida, Naoki Kimura, Takeshi Aikiyo, Tetsuro Ijichi, and Yoshikazu Ikegami, "250 mW—1480 nm Laser Diode Module for Optical Amplifiers (Fol 1404QQ Series)," Furukawa Electric Review, No. 105, Jan. 2000, pp. 19–23. (In Japanese).

Akiro Mugino and Yuichiro Irie, "Output Power Optimization in 980–nm Pumping Lasers Wavelength–Locked Using Fiber Bragg Gratings," Furukawa Review, No. 19, Apr. 2000, pp. 41–46.

Akiro Mugino and Yuichiro Irie, "Output Power Optimization of 980–nm Pumping Lasers Wavelength–Locked Using Fiber Gratings," Furukawa Electric Review, No. 105, Jan. 2000, pp. 24–29. (In Japanese).

Yoshihiro Emori and Shu Namiki, "Demonstration of Broadband Raman Amplifiers: a Promising Application of High–power Pumping Unit," Furukawa Review, No. 19, Apr. 2000, pp. 59–62.

Yoshihiro Emori and Shu Namiki, "Demonstration of Broadband Raman Amplifiers as a Promising Application of High–power Pumping Unit," Furukawa Electric Review, No. 105, Jan. 2000, pp. 42–45. (In Japanese).

Osamu Aso, Masateru Tadakuma, Shu Namiki, "Four–Wave Mixing in Optical Fibers and Its Applications," Furukawa Review, No. 19, Apr. 2000, pp. 63–68.

Osamu Aso, Masateru Tadakuma, Shu Namiki, "Four–Wave Mixing in Optical Fibers and Its Applications," Furukawa Electric Review, No. 105, Jan. 2000, pp. 46–51. (In Japanese).

Hitoshi Shimizu, Kouji Kumada, Nobumitsu Yamanaka, Norihiro Iwai, Tomokazu Mukaihara, and Akihiko Kasukawa, "Extremely Low threshold 1.3 $\mu$m InAsP n–Type Modulation Doped MQW Lasers," Furukawa Review, No. 19, Apr. 2000, pp. 149–154.

Hitoshi Shimizu, Kouji Kumada, Nobumitsu Yamanaka, Norihiro Iwai, Tomokazu Mukaihara, and Akihiko Kasukawa, "Extremely Low threshold 1.3 $\mu$m InAsP n–Type Modulation Doped MQW Lasers," Furukawa Electric Review, No. 104, Jul. 1999, pp. 48–52. (In Japanese).

P. Gavrilovic, et al., "CW High Power Single Lobed Far–Field Operation of Long Cavity AlGaAs–GaAs Single Quantum–Well Laser Diodes Grown by MOCVD," IEEE Journal of Quantum Electronics, vol. 27, No. 7, Jul., 1991, pp. 1859–1862.

H. Yamazaki, et al., "Over Half–Wall Output Power 1.48–$\mu$m Wavelength EDFA Pumping ASM LD's," Optical Fiber Communication Conference and Exhibit 2000 (OFC'2000), Baltimore, Maryland, Mar. 9, 2000.

T. Kamijoh, et al., "Improved Operation Characteristics of Long–Wavelength Lasers Using Strained MQW Active Layers," IEEE Journal of Quantum Electronics, vol. 30, No. 2, pp. 524–532, Feb. 1994, IEEE, New York.

T. R. Chen, et al., "Cavity Length Dependence of the Wavelength of Strained–Layer InGaAs/GaAs Lasers," Applied Physics Letters, vol. 57, No. 23, pp. 2402–2403, Dec. 3, 1990, American Institute of Physics, New York.

Kasukawa, et al., "High Power Semiconductor Lasers for Optical Fiber Amplifiers," Technical report of the Institute of Electronics, Information and Communication Engineers (IEICE), vol. 96, No. 188, Jul. 1996, pp. 23–30. (In Japanese, English–Language Abstract).

Prosyk, et al., "Well Number, Length, and Temperature Dependence of Efficiency and Loss in InGaAsO–Inp Compressively Strained MQW Ridge Waveguide Lasers at 1.3 $\mu$m," IEEE Journal of Quantum Electronics, vol. 33, No. 8, Aug. 1997, pp. 1360–1368.

Hamakawa, et al., "Wavelength Stabilization of 1.48 $\mu$m Pump Laser by Fiber Gratings," 22–nd European Conference on Optical Communication—ECOC '96, Oslo, 1996, vol. 1, pp. 119–122. (no month available).

English Translation of JP–05–206579–A.

Full English translation of: M. Shigehara, et al., "Single Longitudinal Mode Laser Diode using Fiber Bragg Grating," Proceedings of the 1995 of the IEICE General Conference (The Institute of Electronics, Information and Communications Engineers), Mar. 27, 1995, pp. 380.

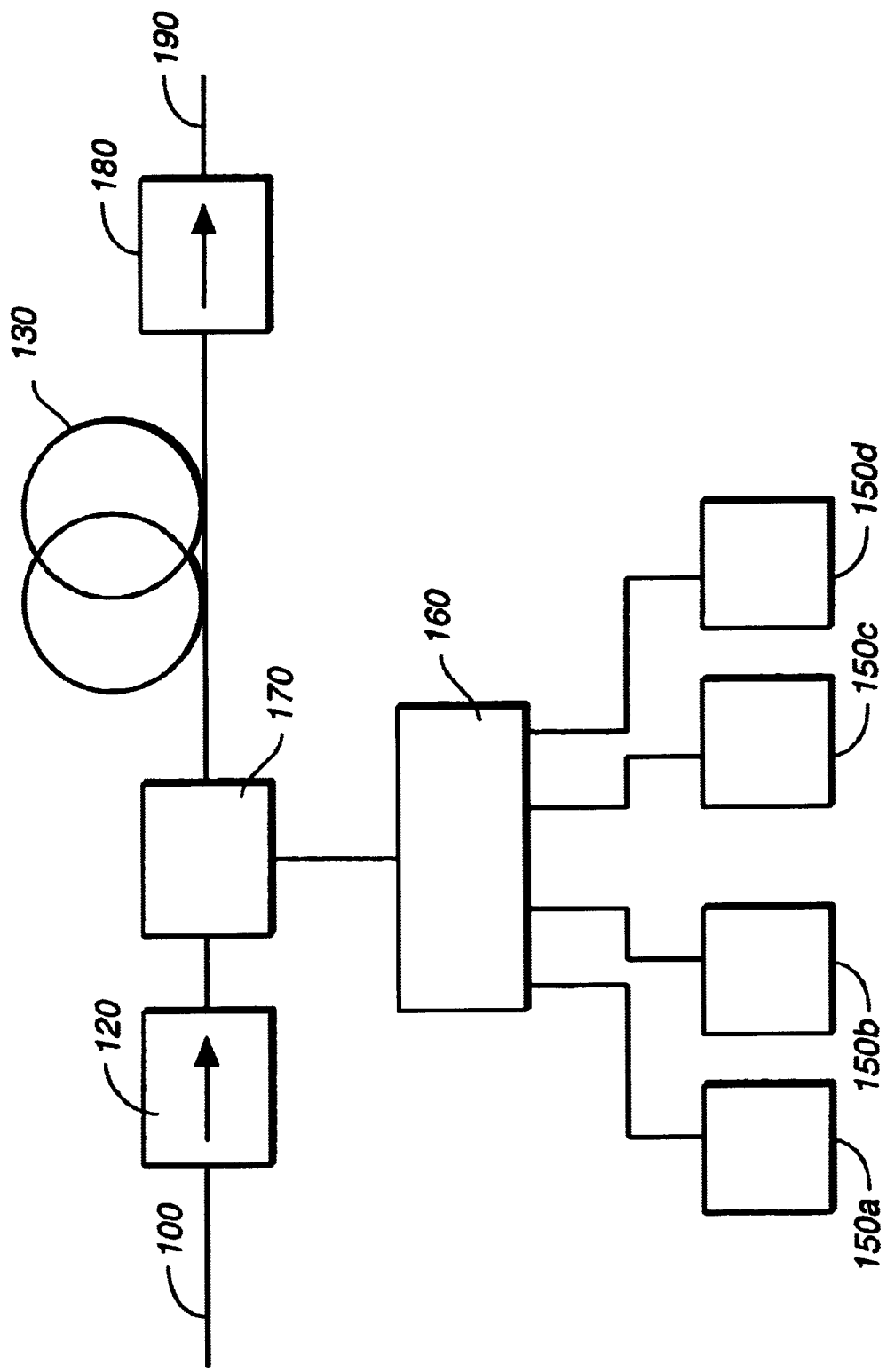
FIG._1

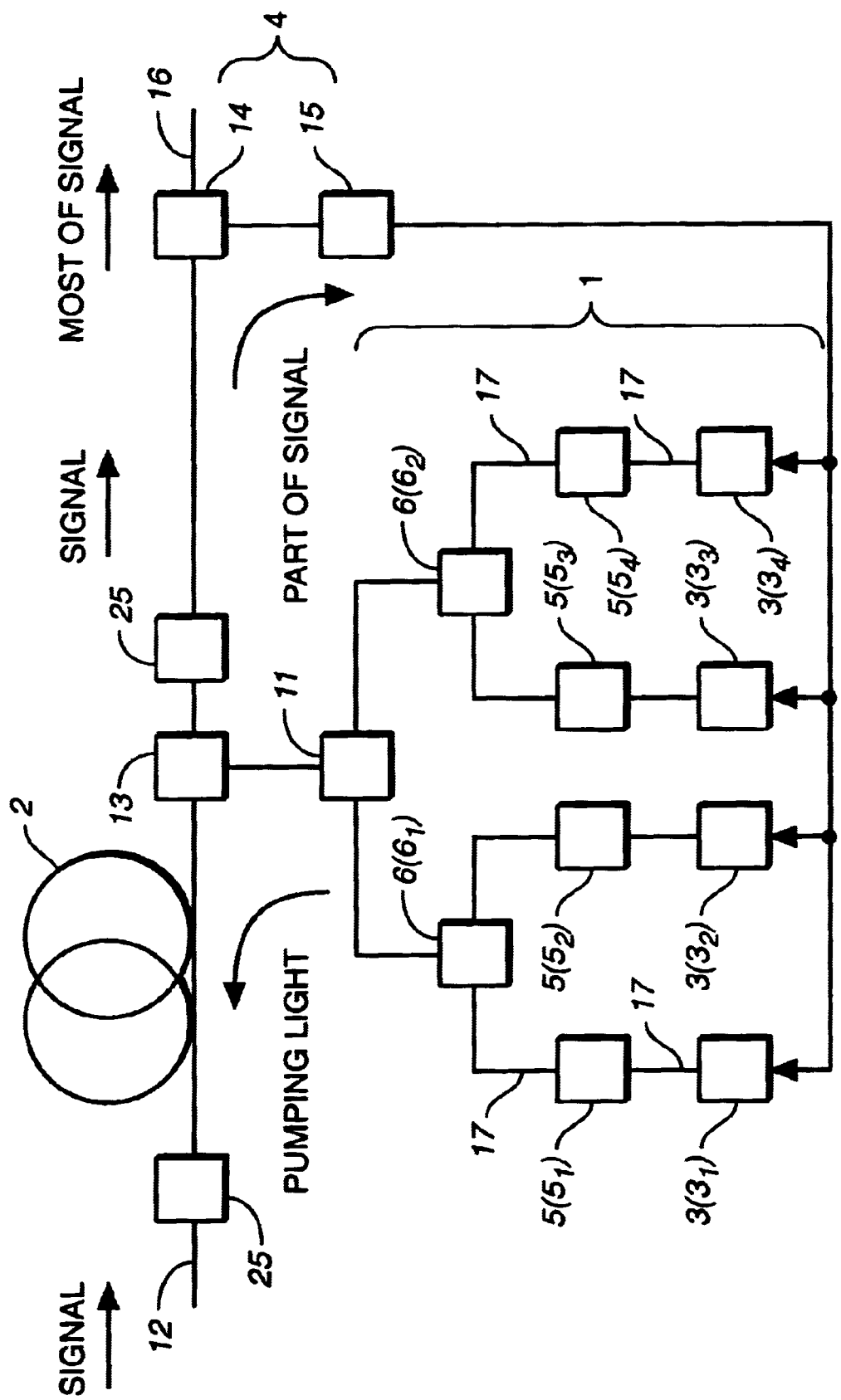
FIG._2

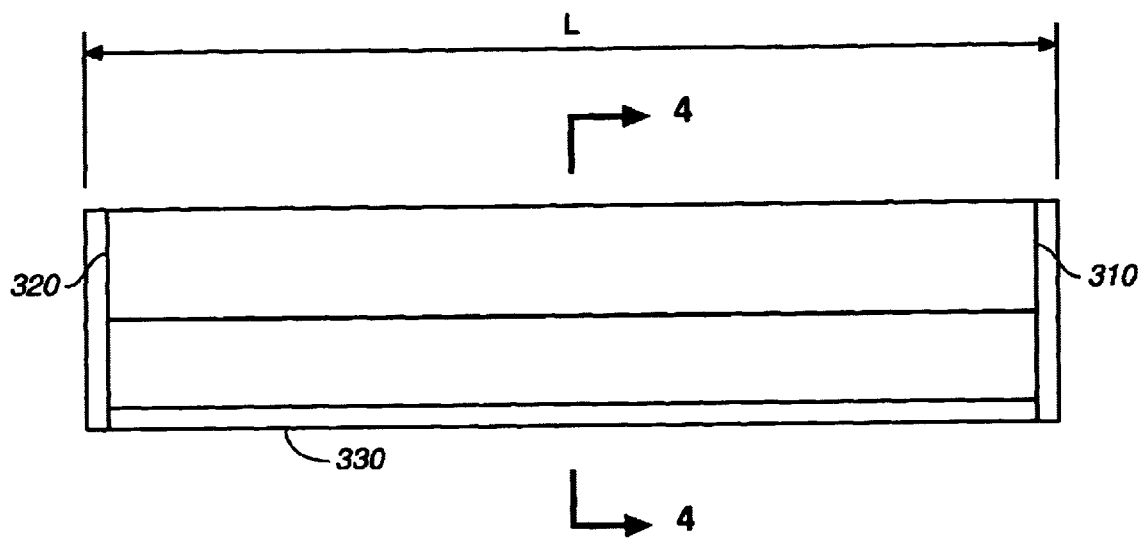
FIG._3
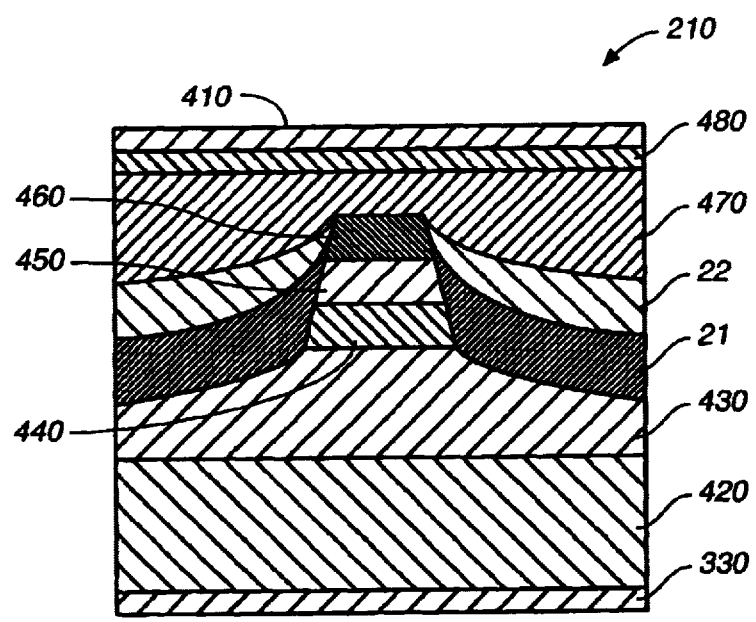
FIG._4

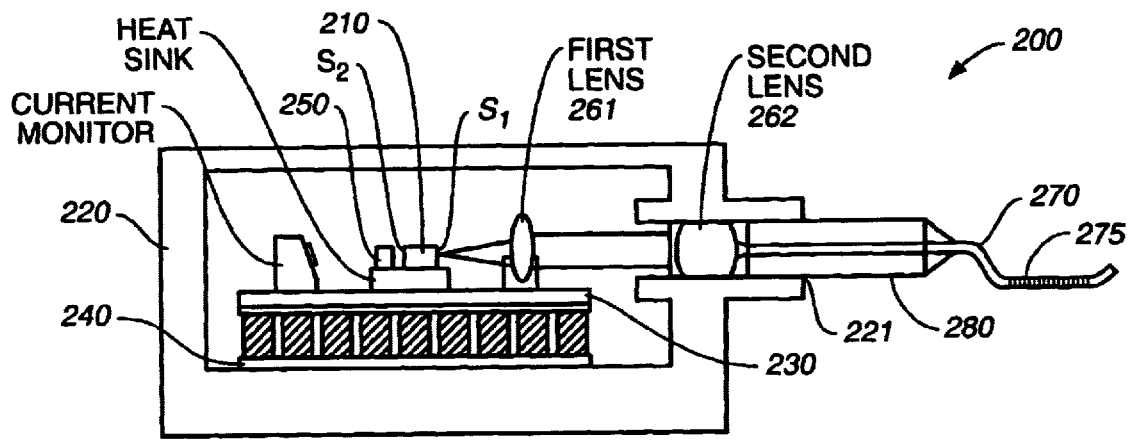
FIG._5
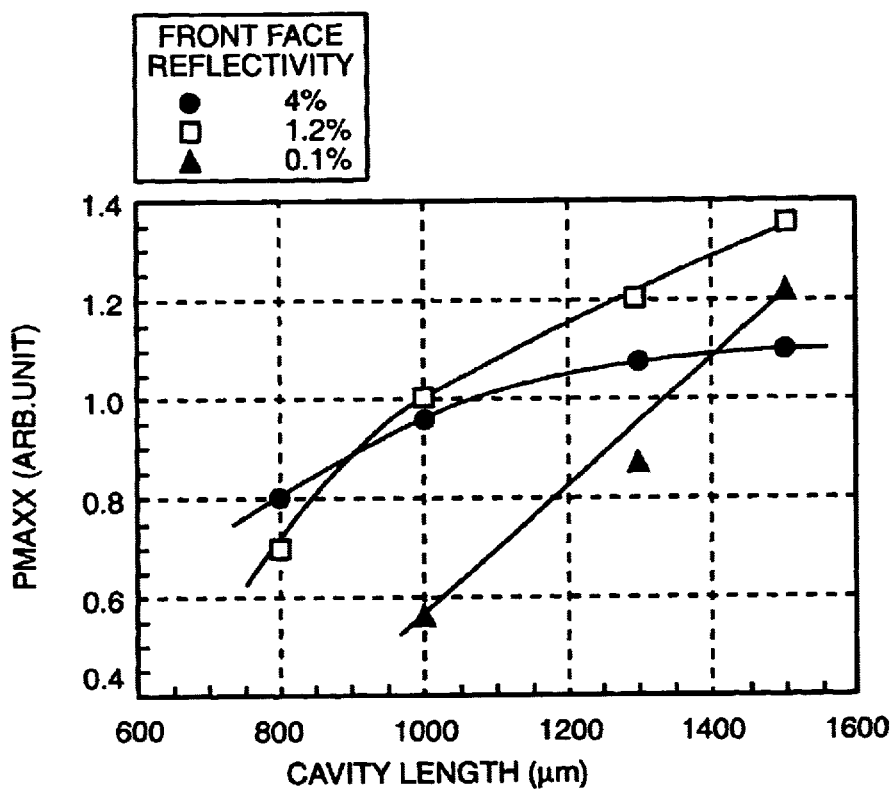
FIG._6

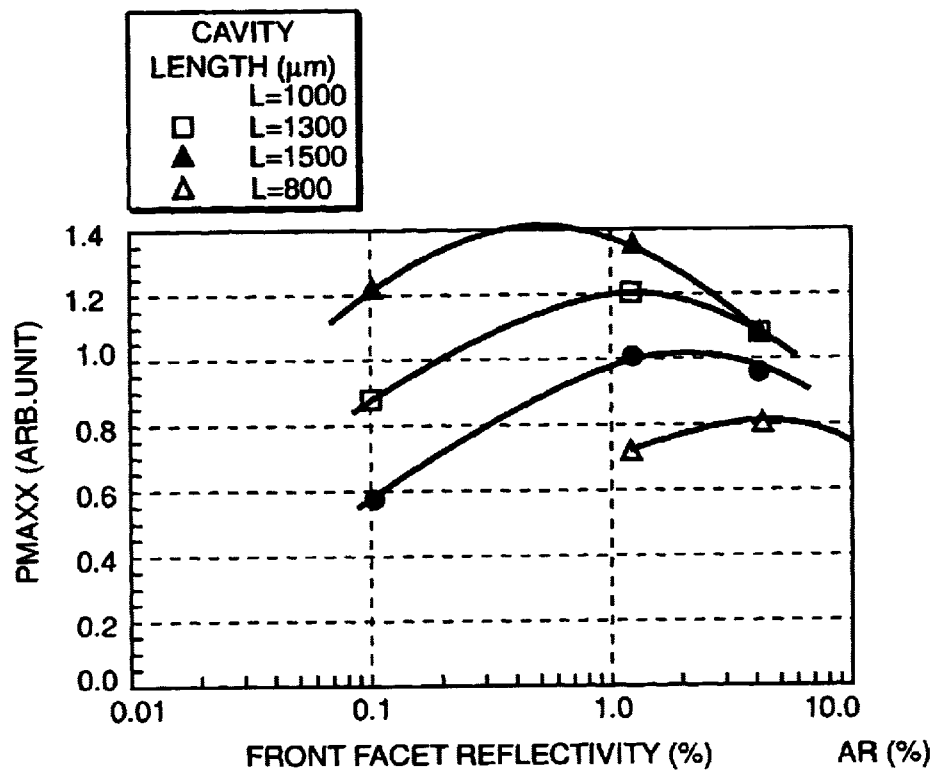
FIG._7
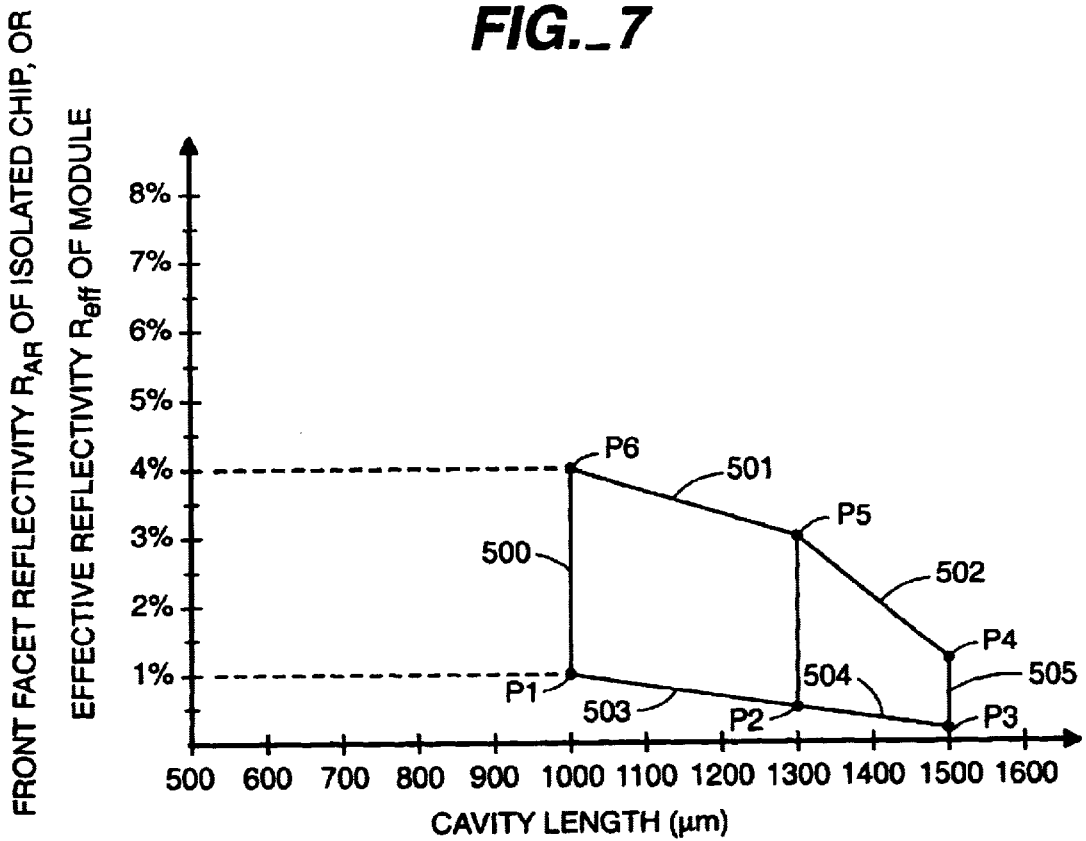
FIG._8

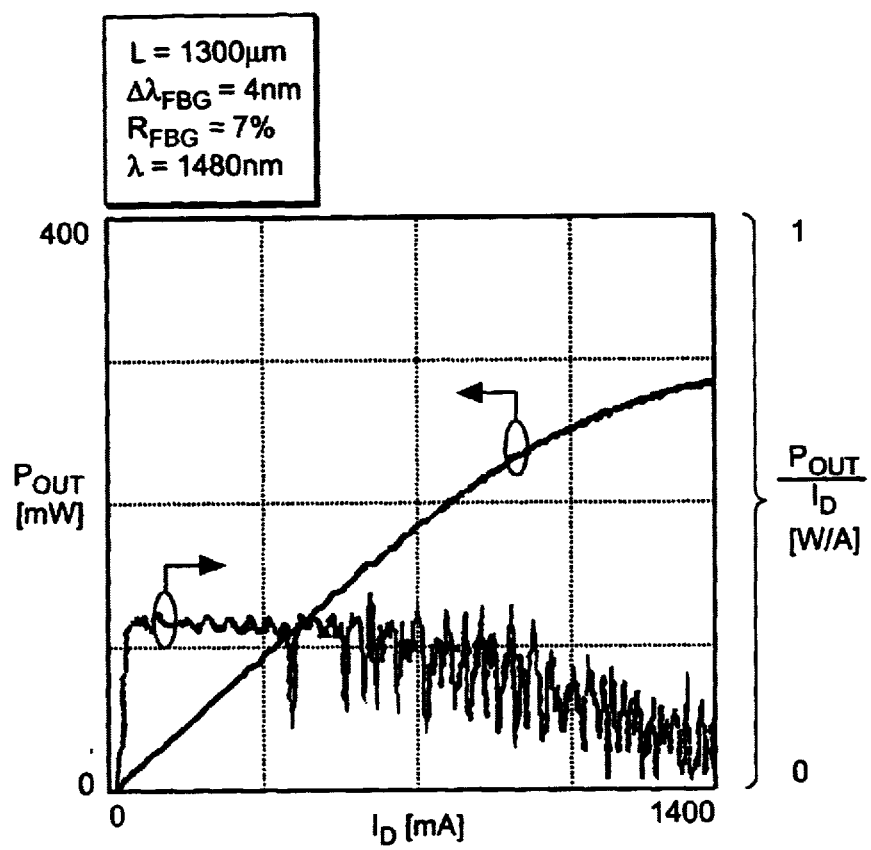
FIG._9
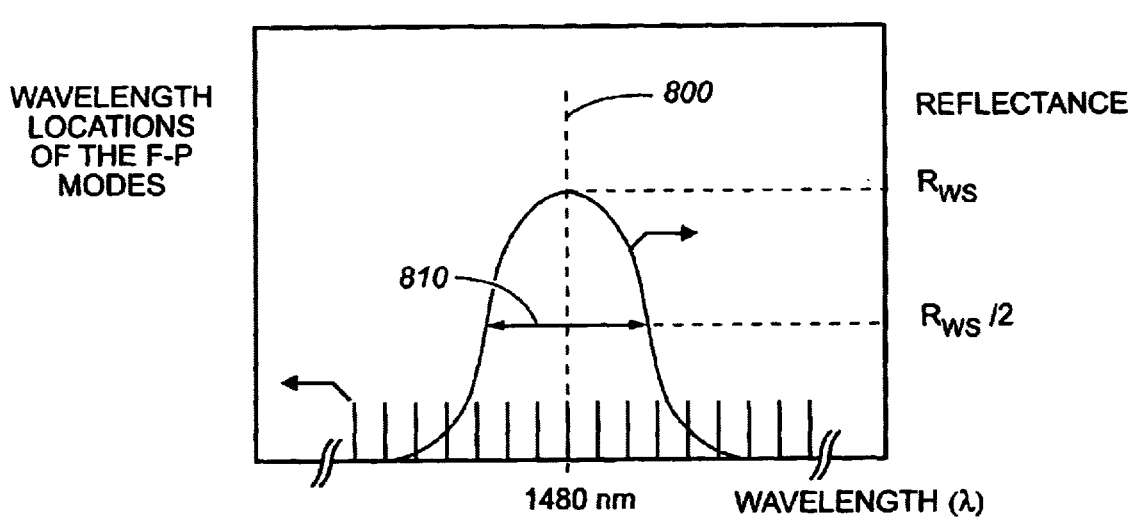
FIG._10

SLOPE EFFICIENCY $\eta_D$ VS. $I_D$
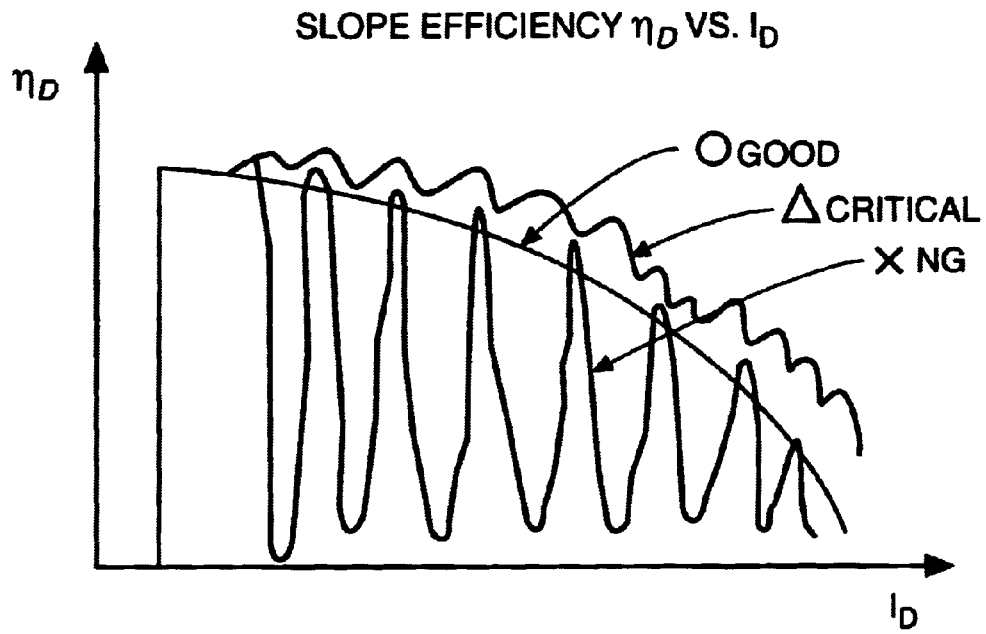
○ GOOD
△ CRITICAL
× NG
FIG._11
| $R_{WS}$ \ $\Delta\lambda_{WS}$ | μm 0.5 | 1.0 | 1.5 | 2.0 | 3.0 |
|---|---|---|---|---|---|
| 1% | × | ○ | ○ | ○ | △ |
| 5% |  | ○ | ○ | ○ |  |
| 7% | × | △ | △ | △ | × |
L=1300μm
FIG._12

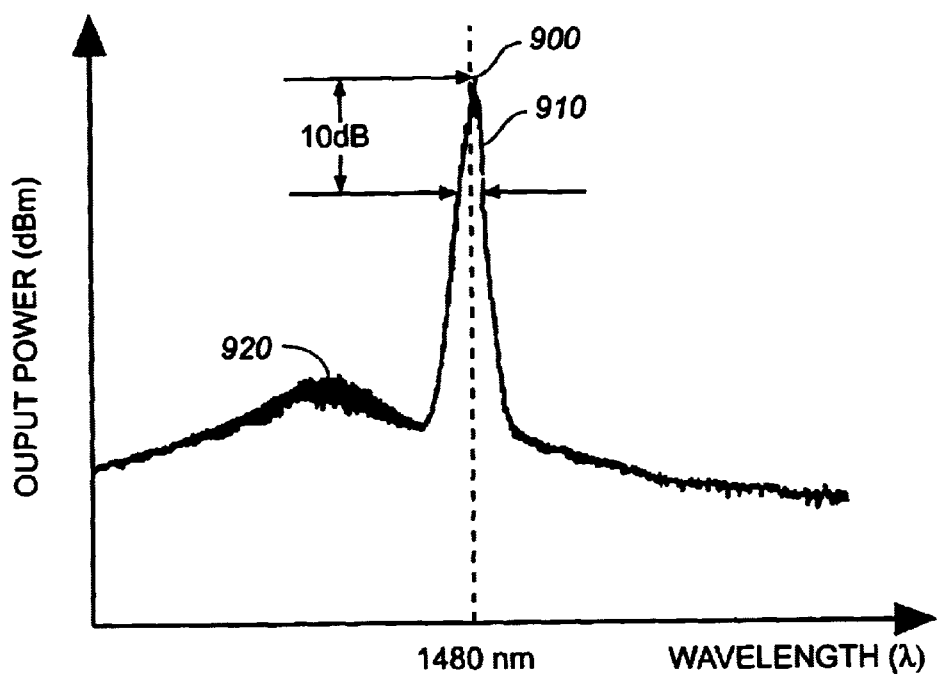
FIG._13
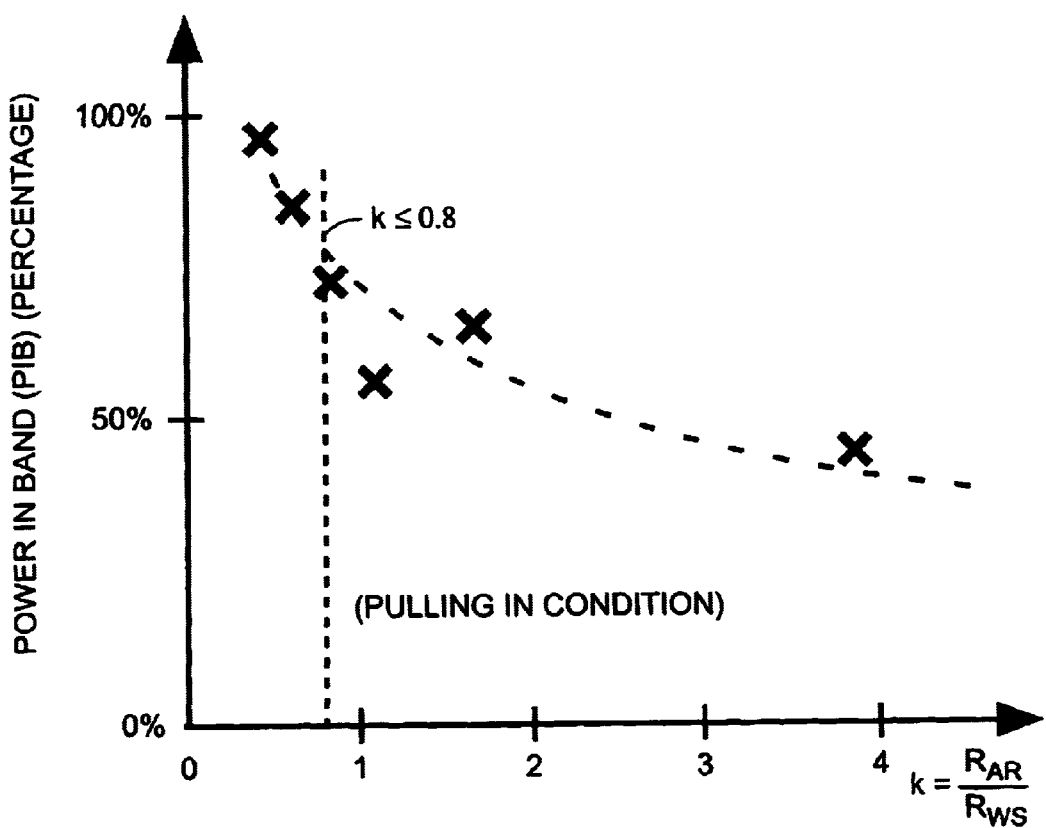
FIG._14

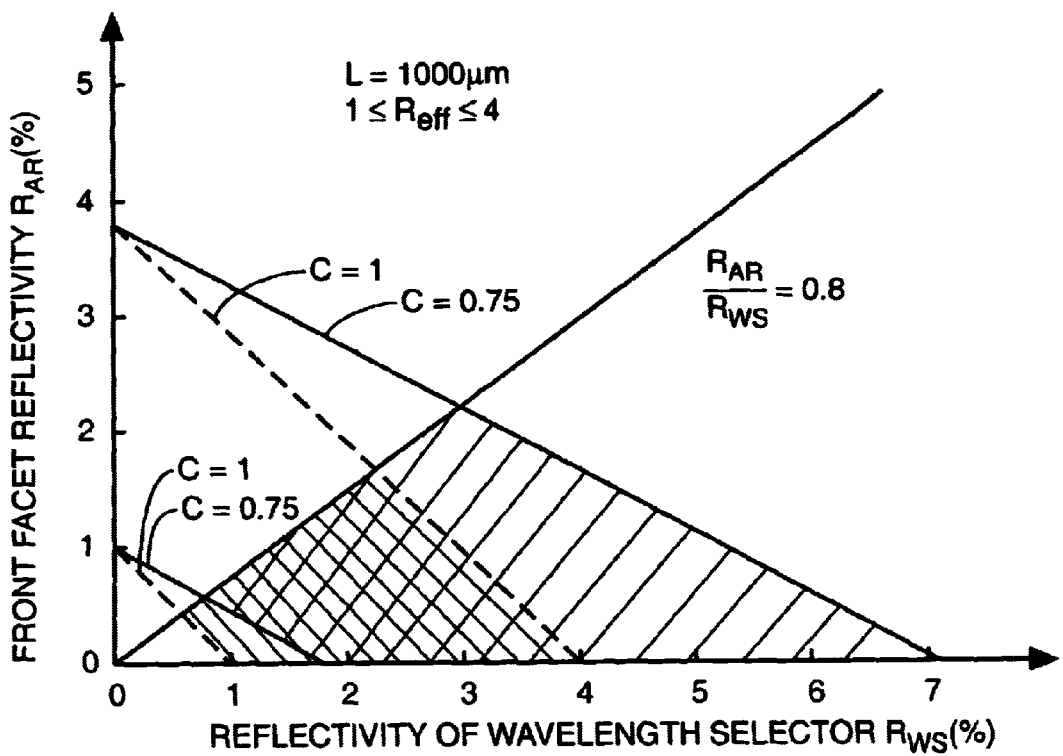
FIG._15
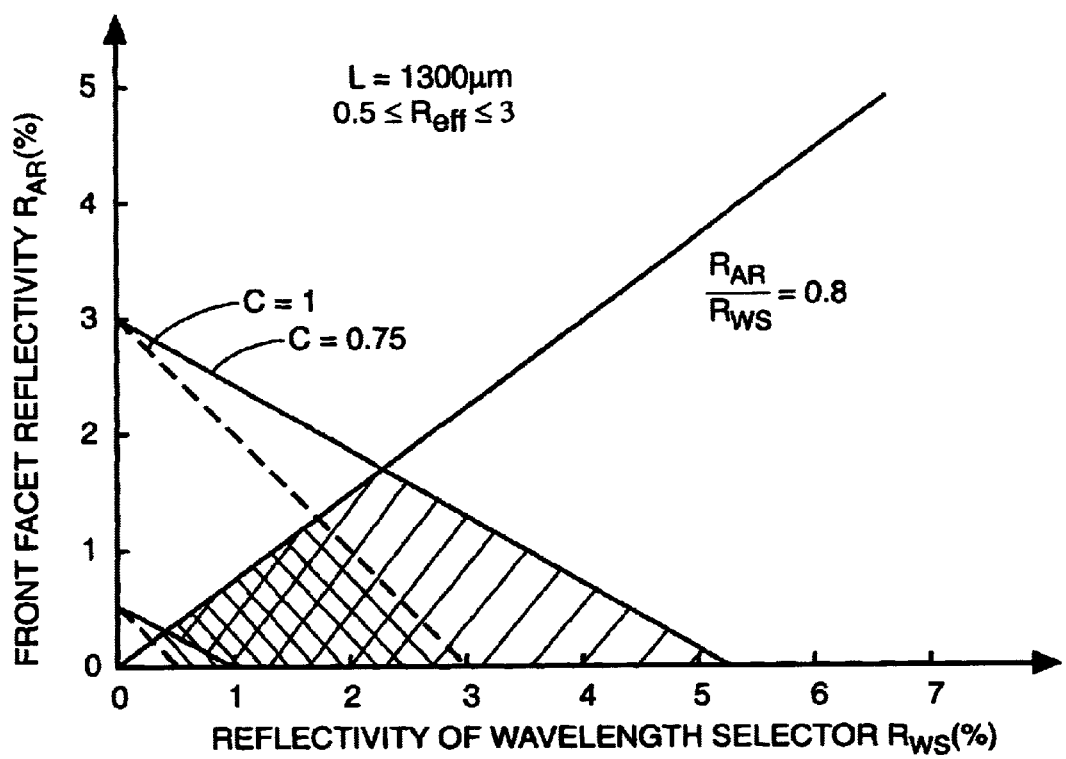
FIG._16

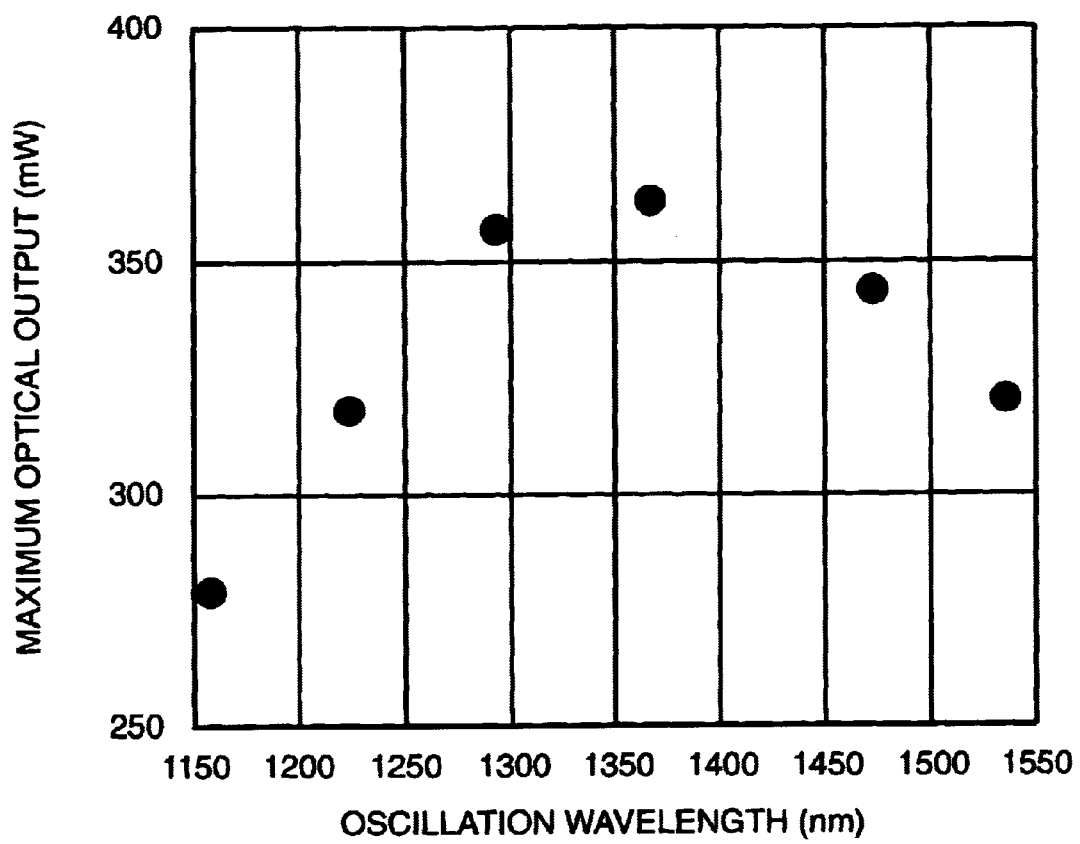
FIG._17

SEMICONDUCTOR LASER DEVICES, AND SEMICONDUCTOR LASER MODULES AND OPTICAL COMMUNICATION SYSTEMS USING THE SAME

RELATED APPLICATIONS

This application is a continuation-in-part of U.S. patent application Ser. No. 09/680,153, filed Oct. 3, 2000, which is a continuation of International application No. PCT/JP00/00590, filed Feb. 3, 2000. International application No. PCT/JP00/00590 claims priority to Japanese patent application number 11-26476, filed Feb. 3, 1999, and Japanese patent application number 11-123868, filed Apr. 30, 1999. The application also claims priority to the following Japanese patent applications: 12-026,130 filed Feb. 3, 2000, 12-236,284 filed Aug. 3, 2000, and 12-286,283 filed Aug. 3, 2000.

FIELD OF THE INVENTION

The present invention is related to optical communications systems, and particularly to dense wavelength division multiplexing laser amplification systems and laser modules for use in such systems.

BACKGROUND OF THE INVENTION

With the explosive growth of the Internet and other communications needs, there has developed a commensurate need for transmission systems to handle the ever increasing demand for capacity to transmit signals. Fiber optic systems have become the technology of choice for meeting this demand. Significant attention has been directed to systems which use dense wavelength division multiplexing (DWDM) to increase the number of signal channels that can be transmitted through a single optical fiber. DWDM systems rely on erbium doped fiber amplifiers (EDFA) which are pumped by semiconductor lasers. Generally, EDFAs are pumped by lasers having a wavelength of about 1480 nm or about 980 nm. There are relative advantages and disadvantages of using lasers in each of these wavelengths, which are known to those skilled in the art. EDFA's are capable of simultaneously amplifying multiple signal channels.

A schematic overview of a known generic EDFA in a DWDM system is depicted in FIG. 1. Signals enter the system through optical fiber 100 and pass through an optical isolator 120 where they are amplified in erbium doped fiber (EDF) 130 which is pumped by a plurality of semiconductor lasers 150a, 150b, 150c and 150d, each of which is fixed, or set, to a specific unique wavelength. Pumping lasers 150a–150d are coupled to EDF 130 using a conventional multiplex couplers 160 and 170. The amplified signals pass through a second optical isolator 180 and out of the system through optical fiber 190. Pumping lasers 150a–150d may be fixed at different wavelengths. For example, pumping laser 150a–150d may have output wavelengths of 1460 nm, 1470 nm, 1480 nm and 1490 nm, respectively. It will be appreciated that more than four pumping lasers may be employed in the system of FIG. 1 to further increase the number of signal channels that can be simultaneously transmitted by the system. However, the number of pumping lasers that can be effectively employed is subject to various constraints. The lasers are required to emit high power, or they are required to produce output spectrums that result in as low loss as possible when being wavelength-multiplexed with the wavelength-multiplex coupler 160. The 3 dB wavelength bandwidth of output light is therefore required to be less than 3 nm, or still more preferably less than 2 nm in order to eliminate the coupling loss at the wavelength-multiplex coupler.

FIG. 2 shows a basic exemplary structure of a Raman amplifier. A WDM optical input signal is coupled into a Raman amplifying fiber loop 2 (a single mode fiber) by way of an input optical fiber 12 and polarization independent isolator 25. A high power beam of light, or pumping light, is generated by pumping source 1 and coupled into fiber loop 2 in the opposite direction by a WDM coupler 13 at an end of fiber 2 which is opposite to the input signal. When the high power pumping light of over 300 mW is coupled to Raman fiber loop 2, a stimulated scattering phenomenon occurs in the molecules of the fiber which causes power from the high-power pumping light to be coupled the input signal light, which acts to amplify the input signal light. The transfer of power occurs only if the frequency of the pumping light is about 13 THz greater than the frequency of the input signal light (which corresponds to the wavelength of the pumping light being about 100 nm shorter than the wavelength of a 1.55 μm input signal). This Raman gain has a −1 dB bandwidth of about 20 nm. In order to generate flat and wide gain band over a 80 nm band like an EDFA amplifier, a wavelength multiplexed pumping light source 1 is needed. The Raman amplifier requires a greater pump power in order to obtain the same gain as that of the EDFA amplifier. Thus, the coupling loss at the wavelength-multiplex coupler is also a important issue in this application. Therefore, in order to realize a stable Raman gain spectrum efficiently, it is important that the power level of pumping source 1 be well controlled and at the same time, the output power bandwidth of each pumping laser should be less than 3 nm, or more desirably be less than 2 nm, and the fluctuation of the center wavelength must be controlled to be less than +−1 nm. Because of the predictable nature of stimulated Raman Scattering phenomenon, a Raman amplifier can be constructed to amplify any desired wavelength so long as a pumping light source can be prepared, which is an advantage over the EDFA amplifier.

The present invention is directed towards semiconductor lasers that can be employed by pumping source 1. As a brief background, pumping source 1 comprises semiconductor lasers $3_1$, $3_2$, $3_3$, and $3_4$ of Fabry-Perot type, wavelength stabilizing fiber gratings $5_1$, $5_2$, $5_3$, and $5_4$, polarization couplers (polarization beam combiner) $6_1$ and $6_1$, and a WDM coupler 11. The fiber gratings $5_1$, $5_2$, $5_3$, and $5_4$ are wavelength-selective reflectors which set the center wavelengths of lasers $3_1$, $3_2$, $3_3$, and $3_4$, respectively. Gratings $5_1$, $5_2$ set the center wavelengths of lasers $3_1$, $3_2$ to a first wavelength $\lambda_1$, and gratings $5_3$, $5_4$ set the center wavelengths of lasers $3_3$, $3_4$ to a second wavelength $\lambda_2$. The difference between $\lambda_1$ and $\lambda_2$ is between 6 nm and 35 nm, and additional sets of lasers and gratings at different wavelengths may also be added to pumping source 1. Light outputs from lasers $3_1$, $3_2$, $3_3$, $3_4$ are polarization-multiplexed by the polarization coupler 6 for each wavelength $\lambda_1$, $\lambda_2$, and output lights from the polarization coupler 6 are combined by the WDM coupler 11 to obtain the output light of pumping source 1. Polarization maintaining fibers 17 are connected between the semiconductor lasers 3 and the polarization coupler 6 to obtain two pumping lights having different polarization planes.

A portion of the output light is coupled by a branching coupler 14 and analyzed by a monitoring and control circuit 15, which determines the amount of amplification that is occurring and generates a feedback control signal to pumping source 1 which ensures consistent amplification (gain).

While FIG. 1 shows the basic construction of an EDFA amplifier and FIG. 2 shows the basic construction of a Raman amplifier, there are many challenges remaining for improving the performance and efficiency of the system, and it is believed that nearly every component of the system can be improved. Among the challenges addressed by the present invention is the need for a higher power pumping laser which has a center wavelength and a level of power that are well-controlled, and which has a very narrow bandwidth output that can be wavelength multiplexed with other such lasers, each typically fixed at different center wavelengths.

Greater power from the pumping lasers enables a repeater in a DWDM system, which typically comprises an EDFA or Raman Amplifier, to amplify the incoming signals to a greater degree, which enables the distance between repeaters to be increased. The latter enables one to reduce the number of repeaters in the system, thereby lowing the cost of the system and increasing the reliability of the system. Greater power also enables the EDFA to amplify more signal channels, and thereby enables the DWDM system to carry more signal channels.

Stable and narrowly confined power from the pumping lasers enables a low loss multiplexing of the individual pumping light with wavelength multiplexing couplers, thereby enabling a multiplexed power to be greater. A stable center wavelength and a well-controlled level of power also enables a Raman gain produced by the pumping light to be stable, thereby preventing associated noise from being modulated onto the input signal.

Conventional approaches to realize a high output power performance of a single laser chip by itself, and the problems to be solved are described below. A conventional semiconductor laser chip (LD) shares some common features with laser chips according to the present invention; for the sake of keeping the number of figures low, we will describe a conventional LD with reference to an exemplary LD 210 according to the present invention which is shown in FIGS. 3 and 4, with FIG. 4 being a cross-sectional view of the device of FIG. 3 across view lines 4—4. The LD 210 shown in FIG. 4 is a buried heterostructure (BH) type Fabry-Perot laser which is fabricated using standard processes for semiconductor laser device fabrication. In FIG. 4, multi-quantum well (MQW) structure is conventionally adopted for active layer 450. The active layer 450, upper and lower graded-index separate confinement structure (GRIN-SCH) layers, 440 and 460, respectively, are formed in a limited spatial region within laser device 210. Adjacent to this structure, current blocking layers 21 and 22, which may be formed of p-InP and n-InP respectively, confine the current flow so the current from electrodes 330 and 410 is injected into active layer 450. After the laser device is cleaved in the cavity length L, a low-reflectivity film 310 is formed on the "front" facet of the device, and a high-reflectivity (HR) film 320 is formed on the "rear" facet, opposite the front facet. Low-reflectivity film 310 is also referred to as anti-reflective(AR) film 310. The features thus far described are common to both the conventional LD and an LD according to the present invention. In a typical prior art laser for high power pumping applications, the cavity length L and the reflectivity of the front facet (as realized with the low-reflectivity film) for the practical high power laser have been chosen to be less than 900 $\mu$m and greater than or equal to 4%, respectively.

In realizing high power LDs, the advantages of adopting 1) strained quantum well structure for the active layer 450 and 2) longer cavity length L has been separately known in the prior art in terms of improving intrinsic performances such as gain performances and of improving the thermal conductance of the chip. However, it was also known that the maximum output power $P_{max}$ tends to saturate when a cavity length exceeds 1000 $\mu$m, with the front-facet reflectivity kept to the same level as that used in the conventional prior art laser chip (greater than or equal to 4%). (In this specification, the term "maximum output power" or "$P_{max}$" refers to the highest optical output power observed when the injection current is increased. The maximum occurs partly due to the drop in quantum efficiency caused by the rise in temperature in the active layer as the current is increased.) For this reason, there has been little motivation to use cavity lengths greater than about 700 $\mu$m to 900 $\mu$m. Thus, the possibility of improving the maximum output power $P_{max}$ by combining the above two approaches 1) and 2) at a cavity length beyond 1000 $\mu$m had not been seriously studied. Particularly, the optimum range in the combination of cavity length of the laser chip and front-facet reflectivity of the chip had not been studied as a practical matter.

In addition to high optical output power, it is important for each individual laser module in a WDM pumping module to have a fixed wavelength output which is independent of the drive current and the environmental (i.e., temperature) conditions. A particular problem with semiconductor pumping laser devices used in fiber optic communications systems is that they tend to have relatively broad output wavelength spectrum which varies with drive current and temperature.

One approach for a stabilized, narrow wavelength band pumping laser has been to use a fiber Bragg grating (FBG) external to the semiconductor laser device which is optically coupled to the laser output and which forms external reflection surfaces of the laser device. The fiber Bragg grating may be fabricated to have a relatively narrow reflectivity bandwidth, such that the output spectrum of the laser is kept within this narrow band. One prior approach has set the reflection band width $\Delta\lambda_{FBG}$ of the FBG to be larger than the twice the longitudinal mode (FP mode) spacing $\Delta\lambda_{FP}$ of the semiconductor laser chip in order to suppress kinks that otherwise appear in the output power vs. injection current diagram. Another prior art approach has used a FBG bandwidth $\Delta\lambda_{FBG}$ of 2 nm to 5 nm in the pumping laser module at a wavelength band around 1480 nm. However, those prior art approaches are based on experiments done on LD's with cavity lengths less than or equal to 900 $\mu$m.

As a consequence of their experimental effort to improve the maximum output power $P_{max}$ by utilizing longer cavity LD's, the inventors have surprisingly found that the kink problem still exists in the FBG-coupled pumping laser module when LD chips with cavity lengths longer than 1000 $\mu$m are used, even if the bandwidth of the FBG includes a plurality of FP modes. Experiments done on a laser with a cavity length of L=1300 $\mu$m and a lasing wavelength at 1480 $\mu$m ($\Delta\lambda_{FP}$=0.24 nm) coupled to a 4 nm bandwidth ($\Delta\lambda_{FBG}$) FBG, which corresponds to as many as 16.7 FP-mode spacings, revealed kinks that appeared in the output power vs. injection current curve, as shown in FIG. 9. This figure shows the output power $P_{OUT}$ as a function of the diode current $I_D$ (Left Axis), and the derivative, or slope, of the $P_{OUT}$ curve, which identified as $dP_{OUT}/dI_D$ (Right Axis). The presence of the kinks is most easily seen in the derivative curve as sharp changes in slope direction. The measurement shows that the prior art teachings are not successfully applicable to FBG-coupled LD's with cavity length of 1000 $\mu$m or longer.

Furthermore, the prior art does not teach constructing the reflectivity characteristics of the low-reflectivity film to provide maximum output power as combined with the reflectivity characteristics of the FBG, or that there is any beneficial relationship between these two reflectivity characteristics, especially when long cavity LD's are used.

SUMMARY OF THE INVENTION

Accordingly, there is a need for an improved pumping laser module for use in DWDM fiber optic communications systems.

Moreover, there is a need for a pumping laser module for use in optical communications systems which are capable of higher powered emissions than currently available lasers.

In addition, there is a need for pumping laser modules which are capable of producing higher powered output in a very narrow bandwidth with a highly stable center wavelength without the presence of kinks in the laser module output.

Further, there is a need for an improved DWDM fiber optic communication amplifier enabling a plurality of closely spaced signal channels to be transmitted in an optical fiber.

In one fundamental aspect, the present invention comprises a semiconductor pumping laser module for use in a DWDM optical communication system wherein the pumping laser module comprises a semiconductor laser diode having a resonator cavity with a cavity length of at least 1000 μm and wherein the semiconductor laser diode is optically coupled to a wavelength-selective reflector, such as a fiber Bragg grating, having a reflectivity bandwidth of about 3 nm or less, and preferably about 2 nm or less. A laser with these characteristics is capable of a relatively high power output of about 300 mW to 500 mW, or more, as measured at the output of the semiconductor laser diode. The narrow reflectivity bandwidth of the FBG or the wavelength-selective reflector enables low loss multiplexing at the wavelength multiplexing couplers used in the EDFA or the Raman amplifier.

Preferably, the semiconductor laser diode has a Fabry-Pérot structure and the length of the resonator is less than about 3500 μm. Preferably, the bandwidth of the wavelength-selective reflector is about 1.5 nm or less, more preferably about 1 nm or less. The laser module of the present invention is suited not only for pumping laser devices which have an output wavelength of about 1480 nm for pumping EDFA's, but also for those having a variety of output wavelengths for pumping Raman amplifiers. The semiconductor laser diode of the present invention preferably is formed from III–V semiconductor compounds using a strained multiple quantum well structure with ten or less wells, and preferably between 1 and 5 wells, wherein the lattice mismatch is greater than about 0.5%, and preferably in the range of about 0.5% to about 1.5%. However, when a strain compensation structure is employed, the limitation on the upper limit values for compressive strain can be increased to over twice the above-mentioned values, specifically to about 3%. The laser diode of the present invention has a high-reflectivity film formed on the rear facet thereof, and a low-reflectivity film formed on the front facet. The high-reflectivity film is preferably constructed to provide a rear-facet reflectivity value of 90% or more, and the low-reflectivity film is preferably constructed to provide a front-facet reflectivity value of 4% or less, with the preferred maximum percentage decreasing as the cavity length increases.

The laser module of the present invention is preferably contained in a package which also includes a thermistor, a Peltier module, and a heat sink for temperature control. A plurality of the laser modules of the present invention may be used in a DWDM system to increase pumping power. In one such system, each of a plurality of laser modules is fixed to a different wavelength. In another such system, a plurality of laser pairs are used, wherein each pair is fixed to an unique wavelength and the two lasers in each pair have light outputs which are polarized orthogonally to each other so that there are two laser outputs at each pumping frequency.

In another fundamental aspect, the semiconductor laser device of the present invention may be used without a wavelength-selective reflector, and/or may be used in environments which are different from the above described modules.

Accordingly, it is an object of the present invention to provide semiconductor laser diodes which have higher output power levels.

It is another object of the present invention to provide semiconductor laser modules which have outputs in a very narrow, highly stable bandwidth without the presence of kinks in the laser output.

It is yet another object of the present invention to improve the performance of DWDM fiber optic amplifiers.

It is a further object of the present invention to enable optical couplers used in optical communication systems to be constructed with higher coupling efficiency by narrowing the bandwidth of the laser outputs.

These and other objects of the present invention will become apparent to those skilled in the art from the following detailed description of the invention, the accompanying drawings, and the appended claims.

BRIEF DESCRIPTION OF THE DRAWINGS

FIG. 1 is a schematic diagram of a DWDM fiber optic communication system employing an erbium doped fiber amplifier.

FIG. 2 is a schematic diagram of a DWDM fiber optic communication system employing a Raman amplifier.

FIG. 3 is cross-sectional view of the semiconductor laser diode of the present invention.

FIG. 4 is a cross-sectional view of the semiconductor laser of the present invention showing the internal structure of the device taken across view lines 4–4.

FIG. 5 is a schematic cross-sectional diagram of a high powered semiconductor laser module in accordance with the present invention.

FIG. 6 is a graph of the maximum output power of a laser device according to the present invention as a function of cavity length, as parameterized by three different values of the front-facet reflectivity provided by the low-reflectivity film.

FIG. 7 is a graph of the maximum output power of a laser device according to the present invention as a function of the front-facet reflectivity provided by the low-reflectivity film, as parameterized by four different values of cavity length.

FIG. 8 is a graph of preferred range of front-facet reflectivity values and cavity lengths of a laser chip according to the present invention for a semiconductor laser chip operated without an optical component which reflects light back to the laser cavity; the vertical axis also indicates the effective front side reflectivity of laser module which comprises a semiconductor laser chip and a wavelength-selective reflector which reflects light back to the laser cavity.

FIG. 9 is a dual graph showing the output power ($P_{out}$:left axis) and the derivative ($dP_{out}/dI_D$:right axis) as a function of drive current($I_D$) of a laser module having a diode cavity length of 1300 µm, a lasing wavelength at 1480 nm, and a 4 nm bandwidth fiber Bragg grating (FBG), a construction of the laser diode following the prior in all other respects.

FIG. 10 is a dual graph showing an exemplary reflectivity curve of a wavelength-selective reflector according to the present invention, and showing the frequencies of the intrinsic longitudinal modes of the laser.

FIG. 11 is a graph of the slope efficiency of the basic exemplary laser structure according to the present invention showing three different stability states of the structure.

FIG. 12 is a table showing the results of a matrix of experimental results on the stability of a basic exemplary laser structure according to the present invention, with the state conditions being shown in FIG. 11.

FIG. 13 is a graph of the optical output spectrum of an exemplary semiconductor laser module according to the present invention showing the presence of a main peak and associated main band and the presence of a secondary peak and associated band.

FIG. 14 is graph of the percentage of the power in the desired main band of the laser plotted as a function of the ratio k of the reflectivity of the front facet to the reflectivity of the wavelength-selective reflector according to the present invention.

FIG. 15 is a graph showing a first exemplary relationship between the reflectivity at the laser's front facet and the reflectivity of the wavelength-selective reflector according to the present invention.

FIG. 16 is a graph showing a second exemplary relationship between the reflectivity at the laser's front facet and the reflectivity of the wavelength-selective reflector according to the present invention.

FIG. 17 is a graph showing the wavelength dependency of the maximum optical output of an exemplary semiconductor laser device of the present invention.

DETAILED DESCRIPTION

Laser diode 210 according to the present invention is now described in greater detail with reference to FIGS. 3 and 4, with FIG. 4 being a cross-sectional view of the diode of FIG. 3 across view lines 4—4. Laser 210 is preferably fabricated from III–V semiconductor compounds using a conventional method for epitaxial crystal growth, such as metal-organic chemical vapor deposition (MOCVD), molecular beam epitaxy (MBE), ultraviolet epitaxy, liquid phase epitaxy, gas-source molecular-beam epitaxy, or chemical-beam epitaxy.

After the wafer is cleaved, a low-reflectivity film 310 is formed on the "front" facet of the device, and a high-reflectivity film 320 is formed on the "rear" facet, opposite the front facet. Low-reflectivity film 310 is also referred to as anti-reflective film 310. Film 310 comprises one or more layers of material, with each layer having a respective thickness and index of refraction. High-reflective film 320 may have a construction similar to that of film 310, or may comprise a layer of reflective metal. Finally, lower and upper electrodes 330 and 410 are formed on the device.

As laser light within the laser cavity propagates toward the front facet, a major percentage of it will be transmitted through the front facet and anti-reflective film 310, and a minor percentage will be reflected back into the cavity, traveling in the opposite direction. The latter percentage is referred to herein as the front-facet reflectivity, and its value depends upon the index of refraction of the active layer and the construction of film 310, the construction being the thicknesses and refractive indices of the one or more layers of film 310. It is well known in the art how one can vary the thicknesses and refractive indices of the one or more layers of film 310 to realize a desired value of facet reflectivity for a given wavelength of light (in this case, the lasing wavelength of the laser diode). Preferably, the front-facet reflectivity realized with low-reflectivity film 310 is about 4% or less for cavity lengths between 1000 µm and 1800 µm and about 2% or less for cavity lengths between 1800 µm and 3500 µm. Deterioration of the quantum efficiency is observed when the reflectivity of the low-reflectivity film 310 is increased above these levels. A rear-facet reflectivity for the rear laser facet may be defined in a similar manner (i.e., the fraction of light which is reflected back into the cavity from the rear-facet), and its value may be chosen through the construction of high-reflectivity film 320. Preferably, the rear-facet reflectivity is greater than about 90%. When a layer of reflective metal is used to construct film 320, it is well known in the art a desired value of the facet reflectivity can be obtained by selecting the amount of metal that is deposited on the facet.

Low-reflectivity film 310 preferably comprises a single layer of $Al_2O_3$ or a dielectric multilayer film comprising alternating layers of $Al_2O_3$ and $SiO_2$. Plasma CVD (PCVD method) or the electronic cyclotron resonance (ECR) sputtering may be used to form low-reflectivity film 310. ECR sputtering is preferable because a high-reliability low-reflectivity film can be formed using it.

The laser device 210 shown in cross-section in FIG. 4 is a buried heterostructure (BH) Fabry-Perot laser which is fabricated as follows using one or more of the above-described epitaxial crystal growth methods, along with other standard processes for semiconductor device fabrication. An n-InP substrate 420 is provided, and a lower clad layer 430 is formed. Lower clad layer 430 may also be an n-InP layer. Next, a lower graded-index separate confinement structure (GRIN-SCH) layer 440 is formed, followed by active layer 450, and upper GRIN-SCH layer 460. Each of these layers may be formed from GaInAsP, with upper and lower GRIN-SCH layers being undoped and active layer 450 having a quantum well structure as described below. Upper clad layer 470, which may be p-InP, is formed on top of layer 460, and cap layer 480, which may be p-GaInAsP is then formed on upper clad layer 470. Upper electrode 410 is then formed on the cap layer, and lower electrode 330 is formed on the bottom of substrate 420.

As shown in FIG. 4, active layer 450 and upper and lower GRIN-SCH layers, 440 and 460, respectively, are formed in a limited spatial region within laser device 210. Adjacent to this structure, layers 21 and 22, which may be formed of p-InP and n-InP respectively, confine the current flow so the current from electrodes 330 and 410 is injected into active layer 450.

Active layer 450 is formed with a strained multi-quantum well (MQW) structure comprising one or more quantum-well layers separated by barrier layers. Specifically, the quantum-well layers involve in-plane compressive strain caused by lattice mismatching between the layers of the structure. Preferably, the lattice mismatch, relative to substrate 420, is greater than about 0.5%, and is preferably in the range of about 0.5% to about 1.5%, and more preferably in the range of about 0.5% to about 1.1%. When the lattice mismatch is lower than about 0.5%, then there is not sufficient strain and the behavior of the system is the same as in a lattice matched system. In this case, the output intensity is not sufficient; for example, such a laser having 1000 µm cavity length has an output significantly less than 200 mW. On the other hand, when the lattice mismatch exceeds about 1.5% (without a strain compensation structure), a relaxation of the crystal distortion is seen, causing degradation of the crystal properties of the resulting structure and of the operating characteristics of the laser device. In addition, the greater the number of wells, and the thicker the well layer thickness, the more severe the problems that occur. The number of wells is less than 10, and preferably between 1 and 5, and more preferably between 3 and 5. Total well thickness which is given by the product of the well thickness and the well number, should desirably less than or equal to 30 nm. When a strain compensation structure is employed, the limitations on the upper limit values for compressive strain and number of wells can be increased to over twice the amount of above-mentioned values. After the structure is fabricated, the resultant crystal structure is cleaved to obtain a device having a desired length L. In preferred embodiments of the present invention, L is set at 1000 μm or greater, and more preferably at 1800 μm or greater. Generally, the greater the value of L, the larger the maximum output of the laser can be, i.e., by using a large L it is possible to obtain a high laser light output. In addition, by selecting a large L the internal electrical resistance of the device decreases, which reduces the heat generated within the device and, thereby, reduces the likelihood of thermal saturation. Also, the thermal mass of the device and surface area of the device are increased as L is increased, so that heat dissipation properties are improved. For a laser in accordance with the present invention having an L of 1800 μm, it is possible to obtain a light output of about 500 mW, as measured at the output of the semiconductor laser device.

Here, the inventors have discovered that the maximum output power from a pumping LD (laser chip) is remarkably improved when the following three features are combined. The first feature is the use of a cavity length L greater than 1000 μm. The second feature is a compressive strained quantum well structure for the active layer of the semiconductor laser diode. The third feature is a front-facet reflectivity of less than 4%, and preferably 3% or less, for the laser diode, with the preferred maximum percentage decreasing as the cavity length increases. These three features are combined to yield power levels greater than that found in prior art short-cavity devices (L≦900 μm).

Experiments performed to characterize the effect of combining the above three features are described below in detail. The buried heterostructure (BH structure) shown in FIG. 4 was fabricated by forming a stacked structure on an n-InP substrate 420 by use of the MOCVD method. The structure comprises:

a lower clad layer 430 of n-InP, a lower GRIN-SCH layer 440 of non-doped GaInAsP, an active layer 450 of a compressed strained multiquantum well structure consisting of five 4 nm-thick quantum wells having a lattice-mismatching rate of +0.8% and four 10 nm-thick barrier layer of GaInAsP interspersed between the quantum well layers and having band gap energy of 1.0 eV, an upper GRIN-SCH layer 460 of non-doped GaInAsP, and a part of an upper clad layer 470 of p-InP.

The formation process then proceeds with forming a current blocking portion with a p-InP layer 21 and an n-InP layer 22 through conventional buried growth technology and further forming a portion of upper clad layer 470 and a cap layer 480 of p-GaInAsP and ohmic contact metals 330, 410. Then, after cleaving the whole structure to form various cavity lengths (L), AR films 310 realizing front-facet reflectivities of 4%, 1.2%, 0.1% were formed on the front facets of three LD chips with $Al_2O_3$ by the ECR sputtering method, and HR films 320 realizing a rear-facet reflectivity of 98% were formed on the rear facets, also by the ECR sputtering method.

FIG. 6 shows measured values of the maximum output power $P_{max}$ as a function of cavity length, as parameterized by the above three different values of front-facet reflectivity $R_{AR}$, as realized with different constructions of low-reflectivity film 310. From these results, the inventors have found that a low front-facet reflectivity value of 1.2% gives larger $P_{max}$ value than a 4% value for cavity length longer than 1000 μm, because the 1.2% curve continues to increase for cavity lengths beyond 1000 μm while the 4% curve begins to saturate. FIG. 7 plots the maximum output power from the laser structure as a function of the front-facet reflectivity value $R_{AR}$, as parameterized by four different cavity lengths $L_1$=800 μm, $L_2$=1000 μm, and $L_3$=1300 μm and $L_4$=1500 μm. From this, the inventors have found that there is a range of front-facet reflectivity values $R_{AR}$ which provides the greatest maximum output power, and that the range depends on the cavity length L. More specifically, when we define the edge of optimum front-facet reflectivity range to be the reflectivity width between the two points which are on respective sides of the peak maxima and which have $P_{max}$ values that are 95% of the peak maxima, we find that the optimum front-facet reflectivity range varies as ~1% to ~4% at L=1000 μm, ~0.5% to ~3% at L=1300 μm, ~0.2% to ~1.2% at L=1500 μm, where "~" means approximately. We may interpolate these values for lengths between 1000 μm and 1500 μm as follows:

$$\sim \left(2.67\% - \frac{L}{300\ \mu m} \times 0.5\%\right) \le R_{AR} \le \sim \left(7.34\% - \frac{L}{300\ \mu m} \times 1\%\right)$$

for ~1000 μm≦L≦~1300 μm, and $$\sim \left(2.45\% - \frac{L}{200\ \mu m} \times 0.3\%\right) \le R_{AR} \le \sim \left(14.7\% - \frac{L}{200\ \mu m} \times 1.8\%\right)$$

for ~1300 μm≦L≦~1500 μm. The area of values covered by the interpolation of $R_{AR}$ is shown in FIG. 8. The preferred values for $R_{AR}$ defined above and shown in FIG. 8 are applicable to the case where the semiconductor laser chip is operated without an optical component which reflects light back to the laser cavity (so-called "isolated chip"). (FIG. 8 also shows the area of preferred values of a module's effective front side reflectivity, which is defined and described below in greater detail.) Thus by adopting longer cavity and low $R_{AR}$ value, maximum output power $P_{max}$ was confirmed to be improved nearly twice as much compared with the value at conventional cavity length L=800 μm and $R_{AR}$=4%.

However, increasing the value of L increases the difficulty of reliable device manufacture due to the formation of undesirable chips, cracks, defects, and other imperfections in the crystal structure of the device. It is presently preferred that the upper limit for L be about 3500 μm. In addition, to prevent the occurrence of stimulated Brillion scattering (SBS) in optical fibers, the spacing between Fabry-Perot modes should not be less than 0.1 nm, which corresponds to keeping cavity lengths less than or equal to approximately 5000$\lambda^2$/n, where λ is an optical wavelength provided in units of microns(μm), and n is the effective index of refraction of the active layer. The typically value of $5000\lambda^2/n$ is about 3200 μm for a lasing wavelength at 1480 nm with n=3.5.

With the invention, the inventors have found that the operating reliability of the laser chip is improved. With the invention, as the cavity length increases beyond 1000 μm, both the saturation drive current and the maximum optical output power increase, and this enables one to increase the maximum rated drive current for the device.

Laser Modules

The laser diode chip according to the present invention may be used alone or in a variety applications. For WDM applications, the laser chips are preferably incorporated into a laser module.

An embodiment of a semiconductor laser module 200 of the present invention is depicted in FIG. 5. A semiconductor laser diode 210 is mounted within package 220. In a preferred embodiment of the present invention, laser diode 210 is preferably a Fabry-Pérot device as described in detail below. Laser diode 210 in mounted on a substrate 230 which, in turn, is mounted on a Peltier module 240. Substrate 230 is preferably highly thermally conductive. Peltier module 240 is used for temperature control. Also mounted on substrate 230 are a thermistor 250 for temperature sensing, and a collimating lens 261 for collecting light from laser 210. From there, the light passes to a focusing lens 262, which focuses the wide beam onto the front facet of fiber 270. The light which is incident the end facet of optical fiber 270 is then coupled into the core of the fiber.

The distal end of optical fiber 270 is mounted within the cylindrical bore of a fiber holder 280, which in turn is inserted into an aperture 221 of package 220. The optical fiber 270 has a Bragg grating 275 formed within the core of the fiber. The Bragg grating in the fiber is an example of a wavelength-selective reflector, and may be formed by conventional means known to those skilled in the art. Only light within a desired band will be reflected by grating 275, and will be returned into laser diode 210 following the reverse light path. The returned light causes stimulated emission in laser diode 210, thereby setting the wavelength of the light emitted by the laser module.

While two lensare shown in FIG. 5, those skilled in the art will appreciate that various types of lenses or combinations of lenses may be used to couple the output of laser device 210 to fiber 270, including a single lens system. For example, a single focusing lens near the output of semiconductor laser diode 210 may be used.

In operation, as laser diode 210 generates heat, changes in temperature are detected by thermistor 250 which is positioned on substrate 230 adjacent to the laser. Thermistor 250 is coupled to an external control circuit (not illustrated) which maintains the temperature of the laser within a controlled range by adjusting the operating current of Peltier module 240.

It is possible to narrowly confine the optical output within a very narrow wavelength bandwidth. Confinement can be accomplished by optically coupling a wavelength-selective reflector, such as fiber Bragg grating 275, to the front facet of the laser. The wavelength-selective reflector reflects light within a desired range of wavelengths back to the laser as a feedback stimulation signal, thereby controlling the bandwidth (i.e., spectrum width) of the light emitted by the laser. Other examples of a wavelength-selective reflector are: (1) a separately-constructed, multilayer dielectric film inserted between low-reflectivity film 310 and fiber 270 (in this case FBG 275 shown in FIG. 5 would not be needed); and (2) a distributed Bragg reflector inserted between low-reflectivity film 310 and fiber 270 (in this case FBG 275 would not be needed). FIG. 10 shows the reflectivity curve of an exemplary wavelength-selective reflector as a function of wavelength. The curve has a peak value $R_{WS}$ at center wavelength 800, and bandwidth 810, as defined between the two points on the curve that are on either side of the center wavelength and which have reflectivity values of $R_{WS}/2$. For reference purposes, FIG. 10 shows an indication of the locations of the F-P modes of the cavity; the locations are indicated by simple lines, and no attempt has been made to show the spectral width or height of each mode. Several F-P modes fall within the reflectivity bandwidth 810 of the wavelength-selective reflector.

When there are only a few peaks in the bandwidth of the wavelength-selective reflector or when the peak reflectivity $R_{WS}$ is not optimized, and when the drive current or operating temperature of the laser changes, "kinks" or non-linearities in the optical output level may arise, as previously shown in FIG. 9. As can be seen in the curve, the light optical intensity curve has a plurality of localized non-linearities with increasing current. Kinks can be caused when the main peak shifts to another F-P longitudinal mode, thereby causing a wavelength shift and associated non-linear changes in the optical power and intensity of the output. Confining the optical output spectrum to a more narrow bandwidth increases the likelihood that kinks will occur as the main longitudinal mode shifts into and out of alignment with the reflectivity curve of the wavelength-selective reflector. In order to avoid kinks in the laser's optical output, the laser output should include a plurality of longitudinal mode subpeaks within the narrow bandwidth of the wavelength-selective reflector.

The longitudinal mode wavelength interval $\Delta\lambda$ is inversely proportional to the length of the resonator, i.e., increasing the length of the laser device resonator cavity decreases the longitudinal mode wavelength interval $\Delta\lambda$. According to the present invention, by increasing cavity length L it is possible to decrease the longitudinal mode wavelength interval, thereby enabling the use of a reduced bandwidth for wavelength-selective reflector 275 while still including multiple longitudinal mode subpeaks in the laser output to suppress kinks.

The inventors have further discovered that the selection of values for the bandwidth $\Delta\lambda_{WS}$ (810 of FIG. 10) and peak reflectivity $R_{WS}$ of wavelength-selective reflector 275 can affect the stability of the laser output. FIG. 11 shows the slope efficiency $\eta_D$ of a laser device under three different stability states. The slope efficiency is equal to the derivative, or slope, of the $P_{OUT}$ curve shown in FIG. 9, as normalized by the quantity 1.24 eV/λ, where λ is the laser's center wavelength provided in units of microns (μm). The smooth curve indicated by the circle symbol is the stable state, and is preferred. The curve with the large ripples indicated by the cross symbol is the unstable state corresponding to the undesired kinks shown in FIG. 9, which are not desired. Finally, the curve with small ripples indicated by the triangle symbol is the critical state which essentially marks the boundary between stable states and unstable states. The critical state can be acceptable for some applications. FIG. 12 shows a table of a matrix of experiments where the reflectivity $R_{WS}$ of the wavelength-selective reflector was varied among the values of 1%, 5%, and 7%, and where the bandwidth $\Delta\lambda_{WS}$ of the wavelength-selective reflector was varied among the values of 0.5 nm, 1.0 nm, 1.5 nm, 2.0 nm, and 3.0 nm, with the cavity length L set at 1300 μm. The table of FIG. 12 shows the stability state of each combination with either a circle (stable), triangle (critical), or cross (unstable). As can be seen, stable or acceptable outputs for cavity lengths greater than 1000 μm are achieved for bandwidths $\Delta\lambda_{WS}$ between 0.5 nm and 3.0 nm and reflectivities $R_{WS}$ less than or equal to 7%. Values of $\Delta\lambda_{WS}$ less than 0.5 nm increases the chances of kinks because there are too few F-P modes. While the inventors are not fully certain as to all the reasons, it is believed that values of $\Delta\lambda_{WS}$ greater than 3.0 nm for cavity lengths greater than 1000 μm increases the chances of the optical energy hopping between modes because of the increased number of F-P modes. In addition, while not fully certain, the inventors believe that values of $R_{WS}$ greater than 7% for cavity lengths greater than 1000 μm creates feedback instability.

The inventors have further discovered that the selection of values for the front-facet reflectivity $R_{AR}$ realized with low-reflectivity film 310 and the peak reflectivity $R_{WS}$ of wavelength-selective reflector 275 can affect the spectral properties of the laser output. Specifically, if the ratio of $R_{AR}$ to $R_{WS}$ ($R_{AR}/R_{WS}$) exceeds approximately 0.8, then a substantial amount of output power will appear in a relatively-wide band outside of the desired band set by the bandwidth of wavelength-selective reflector 275, and the laser output will no longer be narrow banded, but will be substantially bimodal with power distributed into two bands with corresponding peaks 900 and 920, as shown in FIG. 13. The main peak is indicated by reference number 900, whereas the undesirable secondary peak is indicated by reference number 920. The bandwidth of the band around main peak 900 is conventionally defined as those values on either side of the peak which are within 10 dB of the peak's value; the bandwidth of main peak 900 is indicted by reference number 910 in the figure. FIG. 14 shows a graph of the percent of power in the desired main band (PIB), as set by wavelength-selective reflector 275, as a function of the ratio $k=R_{AR}/R_{WS}$. The cross markers show the measured data, and the dotted line shows an empirical fit of the data. At a ratio of k=0.8, roughly 71% to 75% of the power is in the desired main band. As k increases beyond 0.8, this percentage drops to 50%, indicating the presence of two bands (50% in the main band, and 50% in the secondary band). Keeping the ratio $k \leq \approx 0.8$ is referred to herein as the "pulling in condition," as it ensures that the major part of the power that might be emitted outside of the main band is pulled into the main band. In preferred embodiments, k is kept at values of 0.5 and less.

The inventors have further discovered another beneficial feature between the peak reflectivity $R_{WS}$ of the wavelength-selective reflector and the front-facet reflectivity $R_{AR}$ of the laser chip realized with low-reflectivity film 310 (as measured within the reflectivity bandwidth of the wavelength-selective reflector) which increases the performance of the laser device. To describe this relationship, we first define an effective reflectivity $R_{eff}$ based on $R_{WS}$ and $R_{AR}$ as follows:

$$R_{eff} = (C^2 * R_{WS} + R_{AR}), \quad (1)$$

where C is the optical coupling coefficient for light transmitted between low-reflectivity film 310 and the wavelength-selective reflector 275. Optical coupling coefficient C has a value equal to or less than 1, and is typically around 0.75 to 0.95. To realize a higher output power from a module employing a long cavity laser chip, the effective reflectivity $R_{eff}$ is preferably kept within specified ranges, which depend upon the length L of the laser's cavity. As indicated previously, FIG. 8 shows the preferred area for the front-facet reflectivity $R_{AR}$ as a function of the cavity length when the laser is used without a wavelength-selective reflector. Here, we can interpret that FIG. 8 also shows the preferred ranges of $R_{eff}$ for values of L between 1000 μm and 1500 μm for a laser module comprising an LD chip and a wavelegnth selective reflector at the front side of the LD chip. The exterior vertices of this preferred area are defined by the six points P1–P6 shown in the figure, and which have the values provided in Table 1:

TABLE I

| Point | Length | $R_{eff}$ value |
|---|---|---|
| P1 | 1000 μm | 1.0% |
| P2 | 1300 μm | 0.5% |
| P3 | 1500 μm | 0.2% |
| P4 | 1500 μm | 1.2% |
| P5 | 1300 μm | 3.0% |
| P6 | 1000 μm | 4.0% |

A plurality of line segments 500–506 connect points P1–P6 and define the outer edges of the preferred area. Line segments 500–502 define the upper bounds (top side) of the preferred values of $R_{eff}$ for values of L between 1000 μm and 1500 μm, and line segments 503–504 define the lower bounds (bottom side) of the preferred values of $R_{eff}$. The preferred area can be divided into two length ranges, L=1000 μm to L=1300 μm, and L=1300 μm to L=1500 μm. For cavity lengths L in the first range, $R_{eff}$ is preferably selected to have a value between lines segments 501 and 503, which can be mathematically stated as:

$$\sim \left(2.67\% - \frac{L}{300 \ \mu m} \times 0.5\%\right) \leq R_{eff} \leq \sim \left(7.34\% - \frac{L}{300 \ \mu m} \times 1\%\right)$$

for ~1000 μm $\leq$ L $\leq$ ~1300 μm.

As an example for specific values of L, $R_{eff}$ should preferably kept between approximately 1% and approximately 4% when the cavity length L is 1000 μm, between approximately 0.83% to approximately 3.73% when L is 1100 μm, and between approximately 0.67% to approximately 3.47% when L is 1200 μm. For cavity lengths L in the second range, $R_{eff}$ is preferably selected to have a value between lines segments 502 and 504, which can be mathematically stated as:

$$\sim \left(2.45\% - \frac{L}{200 \ \mu m} \times 0.3\%\right) \leq R_{eff} \leq \sim \left(14.7\% - \frac{L}{200 \ \mu m} \times 1.8\%\right)$$

for ~1300 μm $\leq$ L $\leq$ ~1500 μm.

As an example for specific values of L, $R_{eff}$ should preferably kept between approximately 0.5% and approximately 3.0% when the cavity length L is 1300 μm, between approximately 0.35% to approximately 2.1% when L is 1400 μm, and between approximately 0.2% to approximately 1.2% when L is 1500 μm.

By combining above equation (1) and the relation giving the pulling-in condition:

$$R_{AR}/R_{WS} \leq 0.8, \quad (2),$$

the area which satisfies both high output and stable-spectrum performances is given. An example is shown in FIG. 15 when the cavity length is 1000 μm. FIG. 15 is a graph of $R_{AR}$ versus $R_{WS}$ which shows the relationship between $R_{AR}$ and $R_{WS}$ for achieving the desired range of the sum of the effective reflectivities Reff, and which also shows the upper bound for the pulling in condition: $R_{AR}/R_{WS}=0.8$. The upper bound of $R_{eff}=4\%$ and the lower bound of $R_{eff}=1\%$ are shown as two sets of parallel lines for two corresponding values of C, C=0.75 ($C^2=0.56$) in solid lines and C=1 ($C^2=1$) in dashed lines. The lines for the lower bound appear at the left, while the lines for the upper bound appear at the right. The shaded triangular area between these parallel lines and the line of $R_{AR}/R_{WS}=0.8$ define the range of acceptable and preferred values for $R_{AR}$ and $R_{WS}$. FIG. 16 shows the case of a preferred range of values for a cavity length of L=1300 μm, where $R_{eff}$ is between 0.5% and 3%.

EXAMPLES

Example 1

Semiconductor Laser Diode Chip Alone.

A semiconductor laser diode (identified herein as the "Example Device 1") was fabricated according the present invention with the above-described compressive MQW structure (compressive strain of +0.8%), a front-facet reflectivity of 3% realized with low-reflectivity film 310 at the laser diode's front facet, and a reflectivity of 98% realized with high-reflectivity film 320 at the diode's back facet. Both films were formed by ECR sputtering, and film 310 comprised $Al_2O_3$. Several lasers were made in this manner for several cavity lengths, including 1000 μm, 1200 μm, 1600 μm, and 1800 μm. For comparison, a device was fabricated similarly to the case of Example Device 1 except that the active layer 450 had a lattice-matching-system quantum well structure made of GaInAsP. The device was designated as Comparative Example Device 1.

Maximum optical outputs of these two devices were measured for various cavity lengths (L). The Comparative Example Device 1 reached a maximum output power of approximately 175 mW at a cavity length of 800 μm, whereas the Example Device 1 according to the present invention reached a maximum output power of approximately 310 mW at a cavity length of 1200 μm (which corresponds to 0.258 mW per micron of cavity length).

When the Example Device 1 was fabricated, a Comparative Example Device 2 was also fabricated which had the same structure as the Example Device 1, but had a low-reflectivity film 310 which realized a front-facet reflectivity of 5% instead of 3%. In this case, the low-reflectivity film 310 was formed by the PCVD method. The rear-facet reflectivity realized by the high-reflectivity film 320 was kept at 98%. The Comparative Example Device 2 was also fabricated with different cavity lengths (L).

Maximum optical output for the Comparative Example Device 2 was measured for various cavity lengths (L), and was found to reach a maximum output power of approximately 260 mW at a cavity length of 1000 μm, which is approximately 16% less than for the Example Device 1 according the present invention.

In the case of the Example Device 1 having a cavity length (L) of 1200 μm, a low-reflectivity film 310 ($Al_2O_3$) which realizes a front-facet reflectivity of 3% was formed by the electron-beam (EB) vacuum evaporation method and ECR sputtering method respectively to perform an APC (Automatic Power Control) reliability test.

While the change rate of an operating current after operation for 1000 hours was 0.6% in the case of the former method, it was 0% in the case of the latter method.

As is apparent from the above, it is desirable to set the front-facet reflectivity realized with the low-reflectivity film 310 to 3% or less. In this case, it is found that the low-reflectivity film 310 can be formed preferably by the ECR sputtering method.

Example 2

Recently, there has been active research and development in Raman amplifiers as replacements or complements to an erbium-doped optical-fiber amplifier. In Raman amplifiers, a pumping light source having a high output in any wavelength band is desirable.

Therefore, by changing active-layer compositions in the Example Device 1, a laser device for generating oscillating wavelengths of 1150 to 1550 nm was fabricated as the Example Device 2. The cavity length (L) of the laser device was set at 1200 μm and the front-facet reflectivity was set at 3% and the rear-facet reflectivity was set to 98%. (The change in active-layer compositions may be done for any of the laser device embodiments described herein.)

FIG. 17 shows the oscillated-wavelength dependency of the maximum optical output of the above-described laser device. A maximum optical output of 300 mW or more, corresponding to 0.25 mW or more per micron of cavity length, was obtained at an oscillated wavelength of 1200 to 1550 nm. However, an optical output has a tendency of lowering as the oscillated wavelength becomes shorter. This is because a heterobarrier that is an energy difference between an InP cladding layer and an optical confinement layer decreases in a short-wavelength region and thereby, a non radiative current component going over the heterobarrier height between p-InP cladding layer and upper optical confinement layer increases.

Moreover, increasing the thickness of a well layer in a quantum well structure is considered as an exemplary method to further lengthening an oscillated wavelength. In this exemplary method, however, it is estimated that the longer the wavelength, the larger the strain energy accumulated in an active layer due to increase in a well-layer thickness, thus providing a factor for crystallinity-deterioration.

A light-receiving element in an optical communication system uses a light-receiving element made of GaInAs which has an absorption end in the vicinity of 1650 nm, beyond which the light-receiving sensitivity abruptly lowers. Therefore, approximately 1650 nm is a limit as a wavelength of a signal light source at the long-wavelength side. Under such limitation, the pumping light source for a Raman amplifier necessary to amplify the signal should be a high optical output pumping light source at approximately 1550 nm, which is approximately 100 nm (corresponding to Raman-shift frequency of 13 THz at this wavelength) shorter than 1650 nm.

Therefore an optical semiconductor laser device of the present invention can provide a high-output power in a wavelength band between 1200 nm and 1550 nm, and therefore it can be preferably applied not only to a pumping light source that oscillates in 1480 nm band for an erbium-doped optical-fiber amplifier but also to a high-output light source for a Raman amplifier.

Though the above-described Example device uses a GaInAsP-based material, it is also possible to fabricate a laser device in the above-described wavelength band by using a material such as GaInNAs or AlGaInAs.

Though the above-described Example device uses an n-InP substrate, it is also possible to obtain the same advantage by using a p-InP substrate.

As indication previously, the laser output includes a number of longitudinal modes which appear as wavelength subpeaks in the vicinity of the primary peak. These subpeaks are regularly spaced at a wavelength interval which is referred to as the longitudinal mode interval. In the case of a Fabry-Perot type semiconductor laser, the wavelength interval (Δλ) for the longitudinal modes of the semiconductor laser device is given by the following formula:

$$\Delta\lambda = \lambda^2/(2nL) \quad \text{Eq. (3)}$$

(Where λ is oscillation wavelength, n is the active layer effective index of refraction, and L is the cavity length, i.e., the length of the laser device between its optical facets.)

Using equation (3), for a 1480 nm laser having an effective index of refraction of 3.5 in its active layer, the longitudinal mode wavelength interval Δλ is in the range of 0.09 nm–0.17 nm for values of L in the range of 1800 μm–3500 μm, and in the range of 0.17 nm–0.31 nm for values of L in the range of 1000 μm–1800 μm. As indicated above, the wavelength-selective reflector (e.g., fiber Bragg grating 275) has a reflectivity bandwidth 3 nm or less, or preferably about 2 nm or less and more preferably about 1.5 nm or less. With the latter value, the output spectrum of the laser can have a spectral width of 1 nm, or less (spectral width being defined as per FIG. 13). For an exemplary bandwidth of about 1.0 nm for the wavelength-selective reflector and with a range of cavity lengths L=1800 μm to 3500 μm, there are always approximately 5.8 (1/0.17) to 11.1 (1/0.09) longitudinal modes, respectively, in this reflectivity bandwidth of the wavelength-selective reflector. In view of the disclosure of the present invention, it would be within the capabilities of one of ordinary skill in the art to adopt other types of wavelength-selective reflectors, such as semiconductor Bragg reflector or multilayered filters, instead of the above-described fiber Bragg grating.

Thus, according to the present invention, the bandwidth of the laser output can be reduced while avoiding kinks due to changes in the drive current or in ambient temperature conditions. In turn, this enables the reduction of wavelength spacing between pump lasers in a DWDM system to enable more such lasers to be combined to pump a limited gain bandwidth of an EDFA amplifier. Moreover, the narrower laser bandwidth enables more pump lasers with different center wavelengths to be multiplexed into a fiber amplifier (such as an EDFA or Raman amplifier) in order to increase the total power into the amplifier, which enables the amplifier to amplify and transmit more signal channels over longer distances. The more narrow bandwidth also enables one to construct the optical couplers used to combine the pump lasers to have lower coupling and insertion losses. The resulting increase in power from these factors is in addition to the increase in power provided by the strained quantum well structure and the selected front-facet reflectivity values realized with low-reflectivity film 310.

Thus, it can be seen that the present invention allows both increased laser power and narrower laser bandwidth, both of which are important for obtaining improved DWDM fiber optic communications systems.

Industrial Applicability

The semiconductor laser device of the present invention hardly causes deterioration in an output due to internal absorption. Therefore, it can be driven at a high output and thus it is useful as a high-output light source for optical-fiber amplification.

Furthermore, because of a high optical output obtained from a laser module of the present invention, it is possible to substitute single module for a plurality of laser modules used being wavelength-multiplexed or polarization-multiplexed. Therefore, with a laser module of the present invention, it is possible to decrease the number of optical parts used for an optical-fiber amplifier and realize a low-cost and compact pumping light source.

Moreover, by using a wavelength-selective reflector having a reflection bandwidth of 3 nm or less and preferably 2 nm or less, particularly 1.5 nm or less, when the module is fabricated, it is possible to decrease the spectral width of a laser beam emitted from the optical fiber. Thus can be provided a pumping light source having a small loss when wavelength-multiplexed by use of a wavelength-multiplexing coupler with a narrow transmission band and thereby having a higher optical output compared to a conventional light source.

Thus, according to the present invention, it is possible to provide a compact, inexpensive, but high-output optical-fiber amplifier when constituting an optical-fiber amplifier such as an erbium-doped optical-fiber amplifier or Raman amplifier.

Although the present invention has been described in connection with the preferred embodiments thereof, those skilled in the art will appreciate that many modifications and variations can be made without departing from the inventive concepts. Therefore, it is intended that the invention be limited only by the following claims.

What is claimed is:

1. A semiconductor laser device comprising:
   a resonator cavity having a first facet, a second facet, a cavity length L between said first and second facets, and comprising a cavity portion between the first and second facets having a length of at least 1000 microns (μm) and a width along the entire length of said cavity portion that can only support a single transverse mode;
   a strained multi-quantum well structure disposed in said cavity portion;
   a low-reflectivity film on the first facet; and
   a high-reflectivity film on the second facet; and
   wherein the first facet has a facet reflectivity of about 4% or less, and wherein the second facet has a facet reflectivity of about 90% or more.

2. The semiconductor laser device of claim 1 wherein the facet reflectivity of the first facet has a value between approximately $$\left(2.67\% - \frac{L}{300\,\mu m} \times 0.5\%\right) \text{ and } \left(7.34\% - \frac{L}{300\,\mu m} \times 1\%\right)$$

for cavity lengths L between approximately 1000 μm and approximately 1300 μm, and a value between approximately $$\left(2.45\% - \frac{L}{200\,\mu m} \times 0.3\%\right)$$

and approximately $$\left(14.7\% - \frac{L}{200\,\mu m} \times 1.8\%\right)$$

for cavity lengths L between approximately 1300 μm and approximately 1500 μm.

3. The semiconductor laser device of claim 1 wherein the cavity length L is less than or equal to approximately 1800 microns (μm).

4. The semiconductor laser device of claim 1 wherein the cavity length L is between approximately 1800 microns ($\mu$m) and approximately 3500 microns ($\mu$m), and wherein the facet reflectivity of the first facet has a value of about 2% or less.

5. The semiconductor laser device of claim 1 wherein the strained quantum well structure has a lattice mismatch of approximately 0.5% or more.

6. The semiconductor laser device of claim 1 wherein the strained multi-quantum well structure comprises between 1 and 10 wells.

7. The semiconductor laser device of claim 1 wherein the strained multi-quantum well structure comprises between 1 and 5 wells.

8. The semiconductor laser device of claim 6 wherein the strained multi-quantum well structure comprises an active layer which comprises said quantum wells, and wherein the thickness of the active layer is less than or equal to 30 nm.

9. The semiconductor laser device of claim 1 wherein the cavity length L is less than or equal to approximately 3500 microns ($\mu$m).

10. The semiconductor laser device of claim 1 wherein the facet reflectivity of the first facet has a value of 3% or less.

11. A semiconductor laser module, comprising:
a semiconductor laser device having a resonator cavity with a first facet, a second facet, a cavity length L between said first and second facets, and comprising a cavity portion between the first and second facets having a length of at least 1000 microns ($\mu$m) and a width along the entire length of said cavity portion that can only support a single transverse mode, said semiconductor laser device further having a low-reflectivity film on the first facet, a high-reflectivity film on the second facet, and a strained multi-quantum well structure disposed in said cavity portion and having a lattice mismatch of approximately 0.5% or more, wherein the second facet has a facet reflectivity of about 90% or more; and
a wavelength-selective reflector disposed opposite said first facet and optically coupled to the laser device, said wavelength-selective reflector having a reflectivity bandwidth of approximately 3 nm or less, said wavelength-selective reflector bandwidth including a plurality of vertical mode subpeaks of said laser device.

12. The semiconductor laser module of claim 11 wherein said wavelength-selective reflector comprises a fiber Bragg reflector.

13. The semiconductor laser module of claim 11 wherein said wavelength-selective reflector comprises a semiconductor Bragg reflector.

14. The semiconductor laser module of claim 11 wherein said wavelength-selective reflector comprises a multilayered insulater film.

15. The semiconductor laser module of claim 11 wherein said wavelength-selective reflector has a peak reflectivity $R_{WS}$ within its reflectivity bandwidth;
wherein the first facet has a facet reflectivity $R_{AR}$ within the reflectivity bandwidth of the wavelength-selective reflector; and
wherein the ratio of the facet reflectivity $R_{AR}$ to the reflectivity $R_{WS}$ of the wavelength-selective reflector is less than or equal to approximately 0.8 ($R_{AR}/R_{WS}$<= ≈0.8).

16. The semiconductor laser module of claim 11 wherein said wavelength-selective reflector has a peak reflectivity $R_{WS}$ within its reflectivity bandwidth;
wherein the first facet has a facet reflectivity $R_{AR}$ within the reflectivity bandwidth of the wavelength-selective reflector;
wherein the semiconductor laser device has an optical coupling coefficient C for light transmitted between the first facet and the wavelength-selective reflector;
wherein the ratio of the facet reflectivity $R_{AR}$ to the reflectivity $R_{WS}$ of the wavelength-selective reflector is less than or equal to approximately 0.8 ($R_{AR}/R_{WS}$≦≈0.8); and
wherein the reflectivity $R_{WS}$ of the wavelength-selective reflector multiplied by the second power of the coupling coefficient C plus the facet reflectivity $R_{AR}$ ($C^2*R_{WS}+R_{AR}$) is between approximately 0.1% and approximately 4%.

17. The semiconductor laser module of claim 16 wherein said wavelength-selective reflector comprises a fiber Bragg reflector.

18. The semiconductor laser module of claim 16 wherein said wavelength-selective reflector comprises a semiconductor Bragg reflector.

19. The semiconductor laser module of claim 16 wherein said wavelength-selective reflector comprises a multilayered insulater film.

20. The semiconductor laser module of claim 16 wherein an effective reflectivity $R_{eff}$ comprises the reflectivity $R_{WS}$ of the wavelength-selective reflector multiplied by the second power of the coupling coefficient C plus the facet reflectivity $R_{AR}$ of the first facet of the semiconductor laser ($R_{eff}=C^2*R_{WS}+R_{AR}$), and
wherein the effective reflectivity $R_{eff}$ has a value between approximately $$\left(2.67\% - \frac{L}{300\ \mu m} \times 0.5\%\right) \text{ and } \left(7.34\% - \frac{L}{300\ \mu m} \times 1\%\right)$$

for cavity lengths L between approximately 1000 $\mu$m and approximately 1300 $\mu$m, and a value between approximately $$\left(2.45\% - \frac{L}{200\ \mu m} \times 0.3\%\right)$$

and approximately $$\left(14.7\% - \frac{L}{200\ \mu m} \times 1.8\%\right)$$

for cavity lengths L between approximately 1300 $\mu$m and approximately 1500 $\mu$m.

21. The semiconductor laser module of claim 11 wherein the wavelength-selective reflector has a reflectivity bandwidth of approximately 1.5 nm or less.

22. The semiconductor laser module of claim 21 wherein the optical output emitted from the laser module has a spectral width of 1 nm or less.

23. An optical amplifier comprising:
an erbium-doped fiber amplifier having a signal port and a pumping source port; and
the semiconductor laser module of claim 11 having its output coupled to the pumping source port of said amplifier.

24. An optical amplifier comprising:
a Raman amplifier having a signal port and a pumping source port; and
the semiconductor laser module of claim 11 having its output coupled to the pumping source port of said amplifier.

25. A wavelength division multiplexing fiber optic communications system, comprising:

a plurality of semiconductor laser modules coupled to an optical fiber amplifier through an optical multiplexing coupler, each of said semiconductor laser modules comprising a semiconductor laser device having a resonator cavity with a first facet, a second facet, a cavity length L between said first and second facets, and comprising a cavity portion between the first and second facets having a length of at least 1000 microns ($\mu$m) and a width along the entire length of said cavity portion that can only support a single transverse mode, said semiconductor laser device further comprising a low-reflectivity film on the first facet, a high-reflectivity film on the second facet, a wavelength-selective reflector optically coupled to said semiconductor laser device, and a strained multi-quantum well structure disposed in said cavity portion, said first facet having a facet reflectivity of about 4% or less and said second facet having a facet reflectivity of about 90% or more; and wherein each said wavelength-selective reflector has a reflectivity bandwidth of about 3 nm or less, said wavelength-selective reflector bandwidth including a plurality of vertical mode subpeaks of said laser device.

26. The wavelength division multiplexing fiber optic communications system of claim 25 wherein said optical fiber amplifier comprises an erbium doped optical fiber amplifier.

27. The wavelength division multiplexing fiber optic communications system of claim 25 wherein said optical fiber amplifier comprises a Raman amplifier.

28. A semiconductor laser device comprising:

a resonator cavity having a first facet, a second facet, a cavity length L between said first and second facets, and comprising a cavity portion between the first and second facets having a length of at least 1000 microns ($\mu$m), wherein the width of said cavity portion at each point along the length of said cavity portion can only support a single transverse mode;

a strained multi-quantum well structure disposed in said cavity portion;

a low-reflectivity film on the first facet; and a high-reflectivity film on the second facet; and wherein the first facet has a facet reflectivity of about 4% or less, and wherein the second facet has a facet reflectivity of about 90% or more.

29. A semiconductor laser module, comprising:

a semiconductor laser device having a resonator cavity with a first facet, a second facet, a cavity length L between said first and second facets, and comprising a cavity portion between the first and second facets having a length of at least 1000 microns ($\mu$m), wherein the width of said cavity portion at each point along the length of said cavity portion can only support a single transverse mode, said semiconductor laser device further having a low-reflectivity film on the first facet, a high-reflectivity film on the second facet, and a strained multi-quantum well structure disposed in said cavity portion and having a lattice mismatch of approximately 0.5% or more, wherein the second facet has a facet reflectivity of about 90% or more; and a wavelength-selective reflector disposed opposite said first facet and optically coupled to the laser device, said wavelength-selective reflector having a reflectivity bandwidth of approximately 3 nm or less, said wavelength-selective reflector bandwidth including a plurality of vertical mode subpeaks of said laser device.

30. A wavelength division multiplexing fiber optic communications system, comprising:

a plurality of semiconductor laser modules coupled to an optical fiber amplifier through an optical multiplexing coupler, each of said semiconductor laser modules comprising a semiconductor laser device having a resonator cavity with a first facet, a second facet, a cavity length L between said first and second facets, and comprising a cavity portion between the first and second facets having a length of at least 1000 microns ($\mu$m), wherein the width of said cavity portion at each point along the length of said cavity portion can only support a single transverse mode, said semiconductor laser device further comprising a low-reflectivity film on the first facet, a high-reflectivity film on the second facet, a wavelength-selective reflector optically coupled to said semiconductor laser device, and a strained multi-quantum well structure disposed in said cavity portion, said first facet having a facet reflectivity of about 4% or less and said second facet having a facet reflectivity of about 90% or more; and wherein each said wavelength-selective reflector has a reflectivity bandwidth of about 3 nm or less, said wavelength-selective reflector bandwidth including a plurality of vertical mode subpeaks of said laser device.

31. A semiconductor laser device comprising:

a resonator cavity having a first facet, a second facet, a cavity length L between said first and second facets, and comprising a cavity portion between the first and second facets having a length of at least 1000 microns ($\mu$m) and a width along the entire length of said cavity portion that can only support a single transverse mode;

a semiconductor stacked structure formed on a substrate and disposed in said cavity portion, said stacked structure including a pair of GRIN-SCH layers and an active layer having a strained multi-quantum well structure;

a low-reflectivity film on the first facet; and a high-reflectivity film on the second facet; and wherein the first facet has a facet reflectivity of about 4% or less, and wherein the second facet has a facet reflectivity of about 90% or more.

* * * * *